United States Patent
Jung et al.

(10) Patent No.: US 11,211,773 B2
(45) Date of Patent: Dec. 28, 2021

(54) QUANTUM CASCADE LASER WITH MONOLITHICALLY INTEGRATED PASSIVE WAVEGUIDE

(71) Applicant: TRANSWAVE PHOTONICS, LLC., Austin, TX (US)

(72) Inventors: Seungyong Jung, Austin, TX (US); Mikhail A. Belkin, Austin, TX (US)

(73) Assignee: TRANSWAVE PHOTONICS, LLC., Austin, TX (US)

(*) Notice: Subject to any disclaimer, the term of this patent is extended or adjusted under 35 U.S.C. 154(b) by 0 days.

(21) Appl. No.: 16/405,827

(22) Filed: May 7, 2019

(65) Prior Publication Data
US 2020/0313397 A1    Oct. 1, 2020

Related U.S. Application Data

(60) Provisional application No. 62/827,568, filed on Apr. 1, 2019.

(51) Int. Cl.
*H01S 5/00* (2006.01)
*H01S 5/34* (2006.01)
(Continued)

(52) U.S. Cl.
CPC .......... *H01S 5/3402* (2013.01); *G02B 6/1228* (2013.01); *H01S 5/026* (2013.01);
(Continued)

(58) Field of Classification Search
CPC ...... H01S 5/1014; H01S 5/026; H01S 5/3401; H01S 5/021; H01S 5/0207; H01S 5/0208; G02B 6/1228
See application file for complete search history.

(56) References Cited

U.S. PATENT DOCUMENTS

| | | | |
|---|---|---|---|
| 2014/0027708 A1* | 1/2014 | Goyal | H01S 5/2063 257/9 |
| 2019/0229492 A1* | 7/2019 | Cha | H01S 5/0265 |

OTHER PUBLICATIONS

Emilia Pruszyńska-Karbownik et al. "Field distribution in waveguide of mid-infrared strain-compensated InAlAs/InGaAs/InP quantum cascade laser", Opt Quant Electron (2017), pp. 1-8. (Year: 2017).*

(Continued)

*Primary Examiner* — Xinning(Tom) Niu
*Assistant Examiner* — Delma R Fordé
(74) *Attorney, Agent, or Firm* — Haynes and Boone, LLP

(57) ABSTRACT

A photonic integrated circuit device includes a passive waveguide section formed over a substrate, a quantum cascade laser (QCL) gain section formed over the substrate and adjacent to the passive waveguide section, and a taper section disposed between and in contact with each of the passive waveguide section and the QCL gain section. In some embodiments, the passive waveguide section includes a passive waveguide core layer disposed between a first cladding layer and a second cladding layer. In some examples, the QCL gain section includes a QCL active region disposed between a first confinement layer and a second confinement layer, where the QCL active region has a lower index of refraction than each of the first and second confinement layers. In some embodiments, the taper section is configured to optically couple the QCL gain section to the passive waveguide section.

20 Claims, 12 Drawing Sheets

(51) Int. Cl.
    *H01S 5/026*     (2006.01)
    *H01S 5/343*     (2006.01)
    *H01S 5/10*     (2021.01)
    *G02B 6/122*     (2006.01)

(52) U.S. Cl.
    CPC .......... *H01S 5/1014* (2013.01); *H01S 5/3401* (2013.01); *H01S 5/3406* (2013.01); *H01S 5/34313* (2013.01); *H01S 5/1032* (2013.01)

(56) References Cited

OTHER PUBLICATIONS

Q. Yang et al. "Dispersion of effective refractive indices of mid-infrared quantum cascade lasers", Journal of Applied Physics 112, 103109-1 through 103109-5 (2012) (Year: 2012).*

Seungyong Jung et al. "Mid-infrared quantum cascade lasers transfer-printed on silicon-on-sapphire" CLEO 2017 © OSA 2017, pp. 1-2 (Year: 2017).*

Dan Botez et al. "Tapered active-region, mid-infrared quantum cascade lasers for complete suppression of carrier-leakage currents", Proc. of SPIE vol. 8277 pp. 82770W-1 through 82770W-9, 2012 (Year: 2012).*

Michael Bahriz et al. "Design of mid-IR and THz quantum cascade laser cavities with complete TM photonic bandgap" IEEE Xplore: Nov. 21, 2007, p. 1. (Year: 2007).*

Seungyong Jung "Homogeneous photonic integration of mid-infrared quantum cascade lasers with low-loss passive waveguides on an InP platform" vol. 6, No. 8 / Aug. 2019 / Optical Society of America, pp. 1023-1030 (Year: 2019).*

Jung, Seungyong, "Quantum cascade lasers transfer-printed on silicon-on-sapphire", Applied Physics Letters, 2017, 6pp., 111, AIP Publishing.

Jung, Seungyong, "Monolithic integration of mid-infrared quantum cascade lasers coupled with passive InGaAs waveguides", CLEO, 2018, 2pp.

Spott, Alexander, "Quantum cascade laser on silicon", Optica, May 2016, 7pp., vol. 3, No. 5.

Lin, Hongtao, "Mid-infrared integrated photonics on silicon: a perspective", Nanophotonics, 2018, p. 393-420, vol. 7, Issue 2, De Gruyter.

Nguyen-Van, Hoang, "Quantum cascade lasers grown on silicon", Scientific Reports, 2018, 8 pp.

Go, Rowel, "InP-based quantum cascade lasers monolithically integrated onto silicon", Optics Express, Aug. 20, 2018, 5pp., vol. 26, No. 17.

Gilles, C., "Monolithic coupling of QCLs in evanescent waveguides on InP", SPIE, 2015, 6pp., vol. 9370.

* cited by examiner

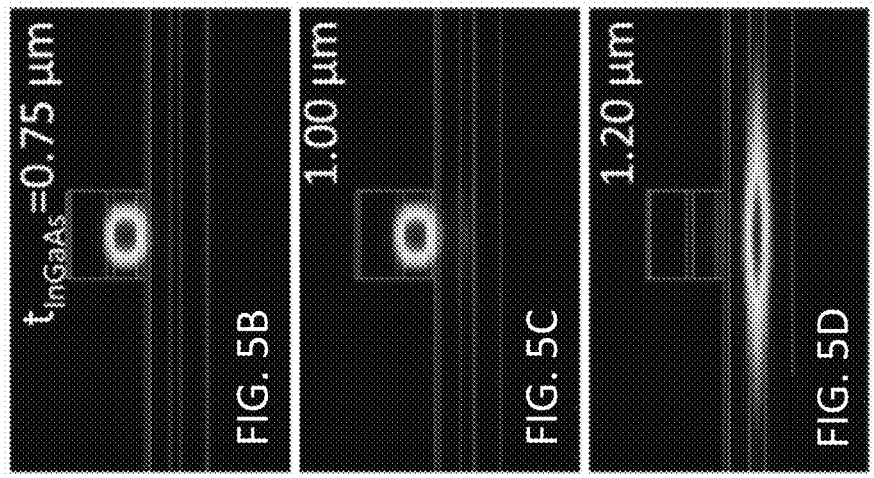
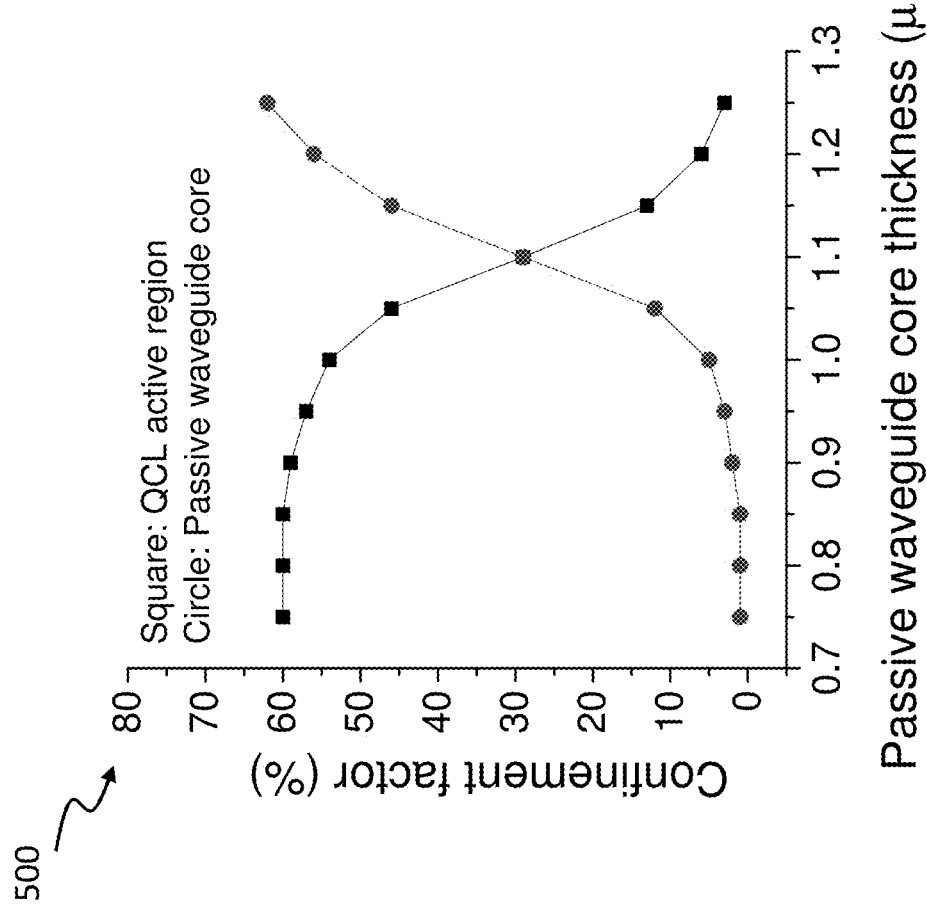
FIG. 5A
FIG. 5B
FIG. 5C
FIG. 5D

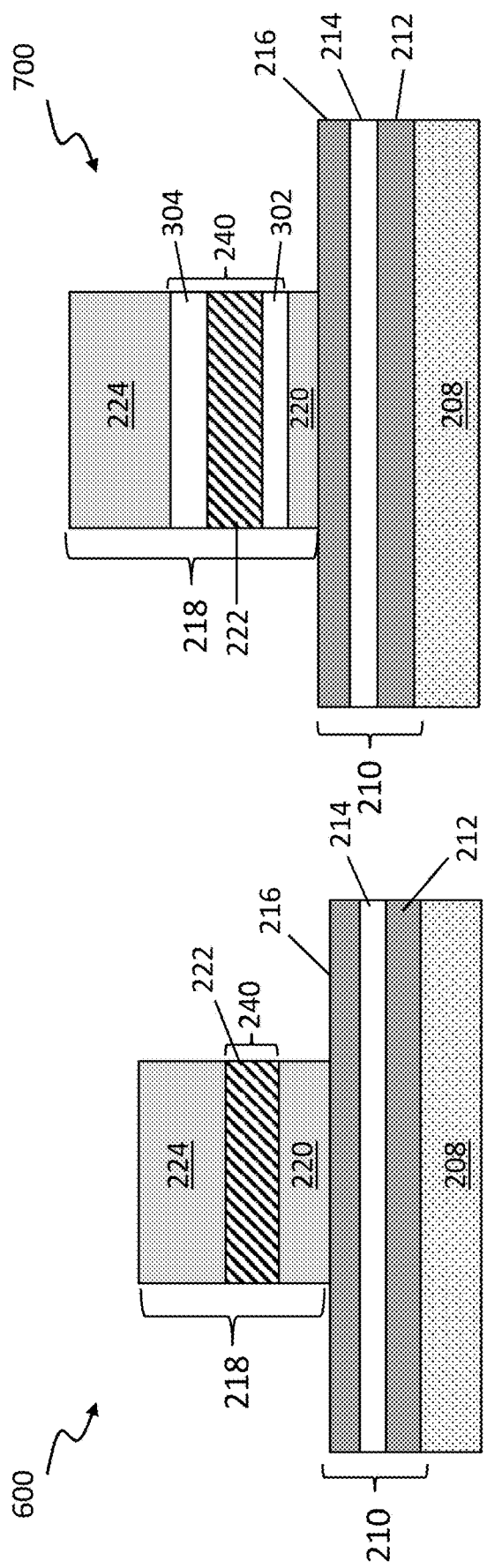
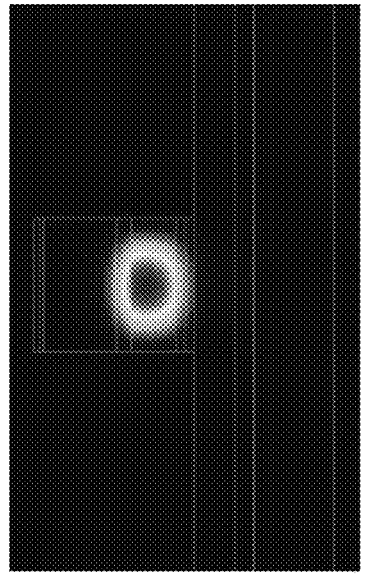
FIG. 7A
FIG. 7B
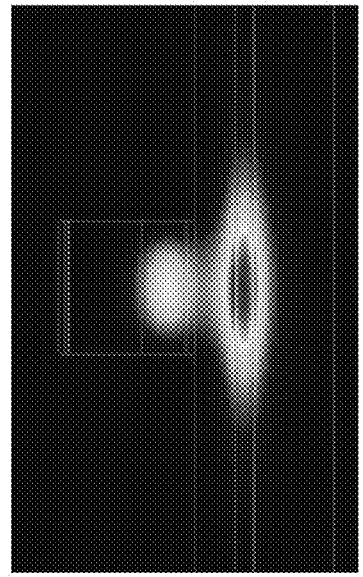
FIG. 6A
FIG. 6B

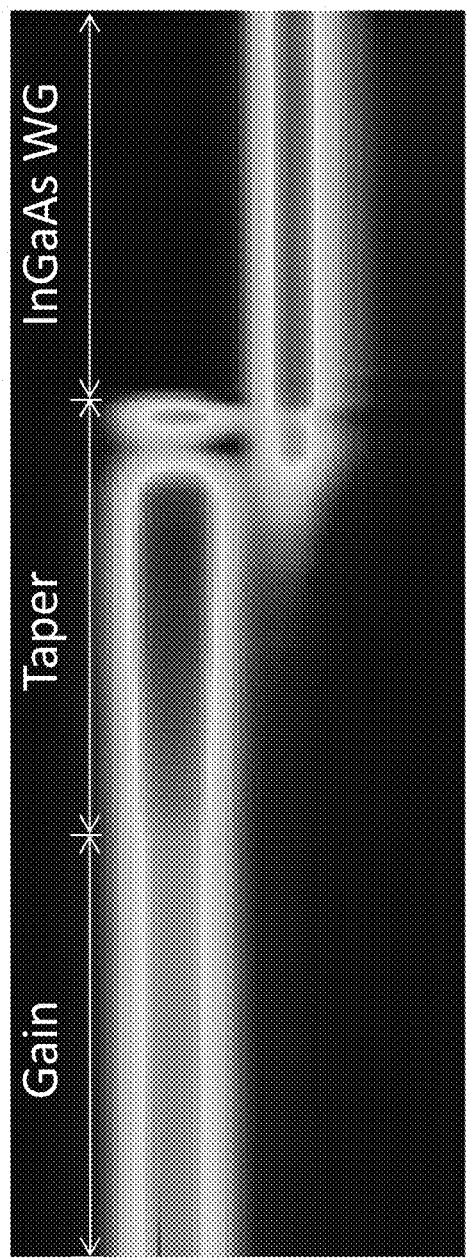
FIG. 9A
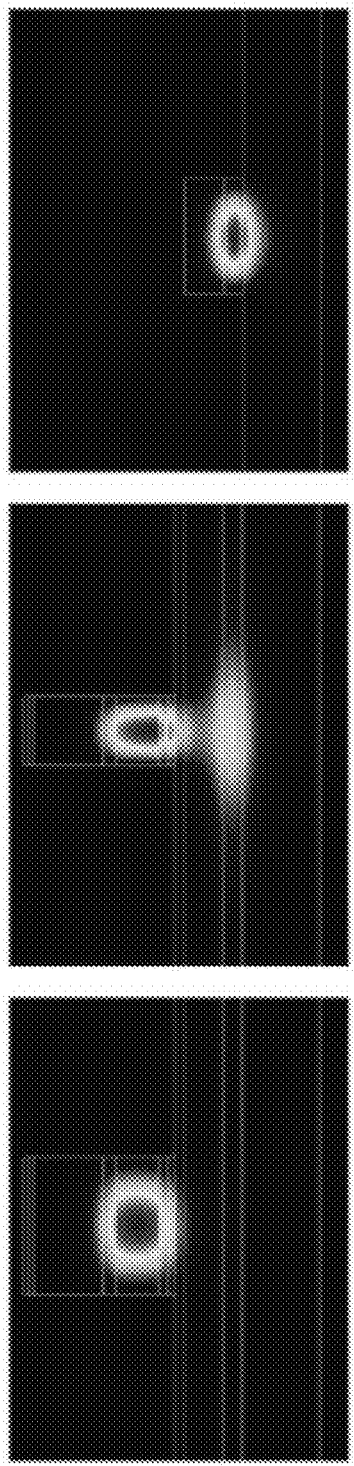
FIG. 9B
FIG. 9C
FIG. 9D

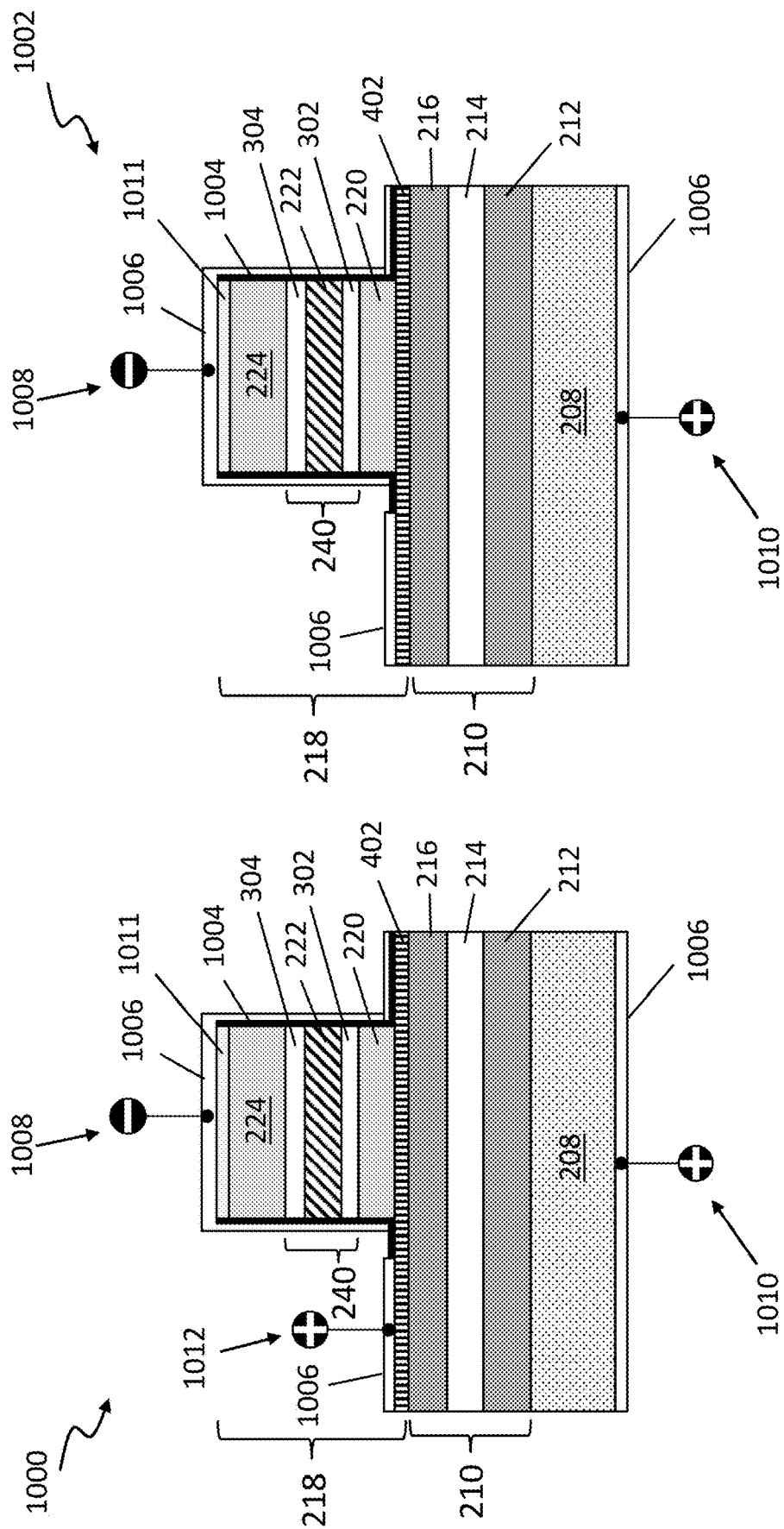

QUANTUM CASCADE LASER WITH MONOLITHICALLY INTEGRATED PASSIVE WAVEGUIDE

CROSS-REFERENCE TO RELATED APPLICATION

This application claims the benefit of U.S. Provisional Application No. 62/827,568, filed Apr. 1, 2019, the entirety of which is incorporated by reference herein.

STATEMENT OF GOVERNMENT SUPPORT

This invention was made with government support under DE-SC0012575 awarded by the Department of Energy. The government has certain rights in the invention.

BACKGROUND

Mid-infrared (mid-IR, $\lambda \approx 3\text{-}30$ µm) photonic integrated circuits (PICs) on low-loss passive waveguide platforms are of great interest for a wide range of mid-infrared applications, including chemical sensing, power combining, beam steering, and frequency conversion. Such devices may transform many traditional mid-IR free-space instruments based on discrete optical components into compact, mass-producible, chip-scale devices where all active and passive devices are combined onto a single chip. With respect to mid-IR light sources, quantum cascade lasers (QCLs) are currently the only electrically-pumped semiconductor light sources that can provide continuous-wave (CW) operation at room temperature in most of the mid-IR spectral range and, with cooling, across the entire mid-IR spectral range.

Thus far, monolithic integration of mid-IR QCLs with passive dielectric waveguides has been demonstrated by heterogeneous integration of mid-IR QCLs on Si-based photonic platforms. For example, QCLs have been integrated onto a silicon-on-nitride-on-insulator wafer, having passive dielectric waveguides define therein, by direct wafer bonding (e.g., by flip-chip bonding). Heterogeneous integration of mid-IR QCLs on silicon-on-sapphire wafers has also be reported based on a transfer-printing technique. Although monolithic integration of QCLs onto silicon-based waveguiding platforms offers some advantages such as compatibility with silicon foundries for processing, such device platforms present inherent thermal extraction and thermal stress issues due to the presence of a physical bonding interface, which is expected to limit their use to low power applications. Efficient thermal extraction is especially critical for QCLs, which typically dissipate more than one order of magnitude higher power per unit area compared to diode lasers. Moreover, given the very high thermal dissipation in QCL active regions, achieving long-term reliability and CW operation of heterogeneously-integrated devices on silicon platforms is challenging. Further, the use of the Si-based platforms limits the spectral range of mid-IR PICs to below 7 µm due to optical absorption in silicon.

Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A illustrates a plot of a confinement factor for the fundamental mode in the QCL active region and in the passive waveguide core as a function of passive waveguide core thickness, in accordance with some embodiments;

FIGS. 5B, 5C, and 5D illustrate cross-sectional profiles (along a section C-C' of FIG. 2B) of a simulated fundamental mode for a plurality of passive waveguide core thicknesses, in accordance with some embodiments;

FIGS. 6A and 7A provide cross-sectional views of devices without and with, respectively, upper and lower confinement layers, along a section substantially similar to section B-B' of FIG. 2A, according to some embodiments;

FIG. 6B shows a cross-sectional profile of the simulated mode confinement, corresponding to the device of FIG. 6A, within the QCL gain section and along a section substantially similar to the section C-C' of FIG. 2B, in accordance with some embodiments;

FIG. 7B shows a cross-sectional profile of the simulated mode confinement, corresponding to the device of FIG. 7A, within the QCL gain section and along a section substantially similar to the section C-C' of FIG. 2B, according to some embodiments;

FIG. 9A provides simulation results for a transverse mode transition of a $TM_{00}$ QCL mode to a $TM_{00}$ waveguide mode along the section A-A' shown in FIG. 2A, according to some embodiments;

FIGS. 9B, 9C, and 9D respectively show cross-sectional profiles of the simulated mode confinement at each of a QCL gain section, a taper section, and a passive waveguide section, according to some embodiments;

FIG. 10A illustrates a device biased according to a top-side-bottom bias configuration, according to some embodiments;

FIG. 10B illustrates a device biased according to a top-bottom bias configuration, in accordance with some embodiments;

DETAILED DESCRIPTION

Figures 1A, 1B:
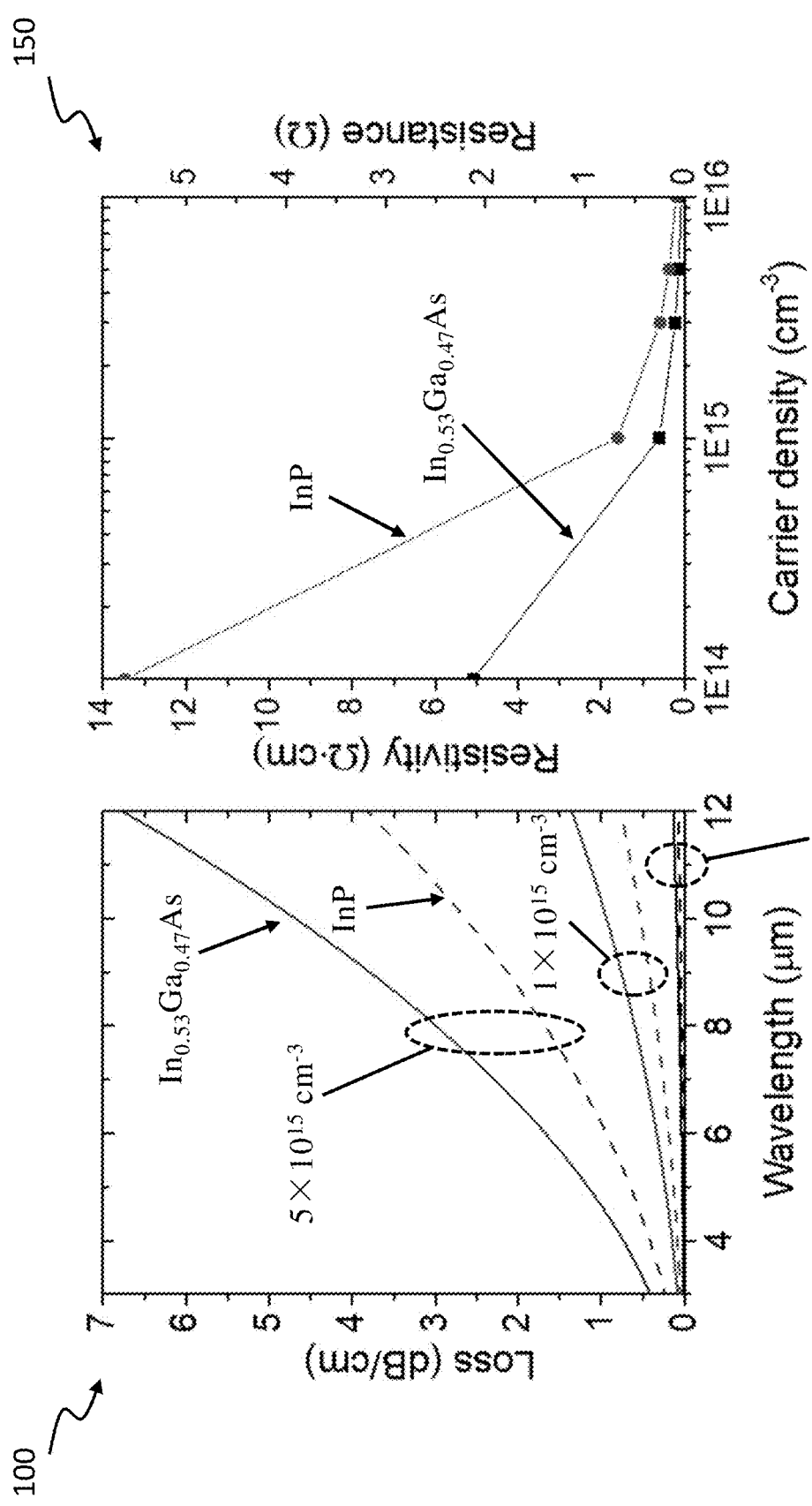
FIG. 1A is a plot showing calculated optical loss as a function of wavelength in various semiconductor materials for a plurality of electron concentrations, in accordance with some embodiments.
FIG. 1B is a plot showing resistivity and resistance as a function of electron concentration for various semiconductor materials, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Quantum cascade lasers (QCLs) are presently the only electrically-pumped semiconductor light sources that can provide continuous-wave (CW) operation at room temperature across most of the mid-IR spectral range and, with cooling, across the entire mid-IR spectral range. As such, monolithic integration of mid-IR ($\lambda \approx 3\text{-}30$ µm) QCLs onto low-loss passive dielectric waveguide platforms are of great interest for the development of mid-IR photonic integrated circuits (PICs) that can provide compact, mass-producible, chip-scale devices where all active and passive devices are combined onto a single chip. Monolithic integration of mid-IR QCLs with passive dielectric waveguides has so far been demonstrated by heterogeneous integration of mid-IR QCLs on Si-based photonic platforms.

For example, QCLs have been integrated onto a silicon-on-nitride-on-insulator wafer by direct wafer bonding. Heterogeneous integration of mid-IR QCLs on silicon-on-sapphire wafers has also be reported based on a transfer-printing technique. However, such integration of QCLs onto Si-based platforms presents inherent thermal extraction and thermal stress issues due to the presence of a physical bonding interface. This is expected to limit the use of QCLs on Si-based platforms to low power applications. Efficient thermal extraction is especially critical for QCLs, which typically dissipate more than one order of magnitude higher power density compared to diode lasers. Moreover, given the very high thermal dissipation in QCL active regions, achieving long-term reliability and CW operation of heterogeneously-integrated devices on silicon platforms is quite challenging. Thus, existing techniques have not proved entirely satisfactory in all respects.

Embodiments of the present disclosure offer advantages over the existing art, though it is understood that other embodiments may offer different advantages, not all advantages are necessarily discussed herein, and no particular advantage is required for all embodiments. For example, embodiments discussed herein include mid-IR PICs providing homogeneous monolithic integration of mid-IR QCLs with a low-loss passive waveguide heterostructure that is grown together with a QCL heterostructure on a III-V-based platform, such as an InP-based platform. In such an approach, a mid-IR QCL heterostructure and a low-loss passive waveguide heterostructure (e.g., such as a low-loss passive InGaAs waveguide heterostructure) are formed together on a single substrate (e.g., such as an InP substrate), thereby mitigating challenges associated with heterogeneous integration of mid-IR QCLs on Si-based photonic platforms. Moreover, and as a result of employing homogenous monolithic integration, the layer growth and other processing steps may be compatible with those used for conventional high-performance mid-IR QCLs. In addition, unlike InP-based diode lasers in the near IR range, photon energy in the mid-IR band is several times smaller than band gap energies of InP-based material systems (InGaAs, InAlAs, etc.) used in mid-IR QCLs. As a result, III-V mid-IR PICs, such as those described herein, can avoid the problems of multi-photon absorption that are present in near-infrared III-V PICs.

The disclosed mid-IR PICs also provide for room temperature mid-IR QCL operation and coupling to passive waveguides (e.g., such as passive InGaAs waveguides) grown monolithically on the same wafer (e.g., the same InP wafer). In accordance with some embodiments, the mid-IR PICs disclosed herein include a QCL gain section, a taper section, and a passive waveguide section (e.g., such as an InGaAs passive waveguide section). Lasing operation and coupling of a QCL mode into a passive waveguide mode may be achieved by designing a QCL waveguide that confines the laser mode in the QCL active region of the QCL gain section and employing an adiabatic taper within the taper section to couple the QCL mode to the passive waveguide mode, as described in more detail below. In various examples, a lower confinement layer and an upper confinement layer may also be formed to provide high refractive index layers above and below the QCL active region of the QCL gain section, which improve laser mode confinement and provide for efficient lasing operation. In some embodiments, the taper section includes a two-step adiabatic taper of a QCL heterostructure that is used to monolithically couple QCL light into the passive waveguide. In some cases, the taper section also includes an adiabatic taper of a passive waveguide heterostructure. In one example, over 400 mW of mid-IR optical power at $\lambda \approx 4.6$ µm may be coupled into a 5-µm-wide passive waveguide with a 750-nm-thick undoped $In_{0.53}Ga_{0.47}As$ core surrounded by undoped InP cladding layers. For purposes of this disclosure, the term "undoped" may be used to describe a semiconductor layer or region that is not purposefully doped (e.g., by an ion implantation process, diffusion process, or other doping process). In an embodiment, the disclosed devices may provide an output power of 290 mW measured from the passive waveguide facet at room temperature. Such an output power is nearly an order of magnitude higher compared to the best results obtained with heterogeneously-integrated QCLs on Si at a similar operation wavelength. Generally, the embodiments disclosed herein represent a critical step towards the development of mid-IR QCLs PICs demanding continuous-wave and high-power operation for practical applications such as chemical sensing, power combining, and beam steering. Other embodiments and advantages will be evident to those skilled in the art upon reading the present disclosure.

In various embodiments, the monolithic integration of mid-IR QCLs as disclosed herein includes the use of $In_{0.53}Ga_{0.47}As/InP$ material systems for the passive waveguide and cladding layers. Intrinsic $In_{0.53}Ga_{0.47}As$ and InP materials are nearly transparent in the mid-wave-IR (MWIR, $\lambda \approx 3$-5 µm) and long-wave-IR ($\lambda \approx 5$-12 µm) ranges. Thus, the actual loss in waveguides made of $In_{0.53}Ga_{0.47}As$ and InP materials may be principally determined by free carrier loss due to unintentional doping, as well as by fabrication imperfections such as waveguide sidewall roughness. In some examples, a background doping level of undoped InP and $In_{0.53}Ga_{0.47}As$ may be in the range of $1$-$5 \times 10^{15}$ cm$^{-3}$. Therefore, in some cases, an "undoped" semiconductor layer may include a layer having a doping concentration in the range of $1$-$5 \times 10^{15}$ cm$^{-3}$.

It is also noted that for the III-V material systems described herein, and in some embodiments, the dopant species used to dope one or more of the disclosed III-V material layers may include Si. To be sure, in some embodiments, other dopants, such as sulfur, selenium, or tin, may equally be used without departing from the scope of the present disclosure. For most operating regimes of the disclosed mid-IR PICs, it may be assumed that substantially all dopants introduced into the one or more III-V material layers of the disclosed devices are fully ionized and contribute to providing free carriers. As such, doping concentration of a particular material layer may be substantially the same as free electron concentration. Thus, for purposes of this disclosure, the terms "doping level", "doping concentration", "carrier concentration", "electron concentration", and "free electron concentration" may at times be used interchangeably throughout the discussion that follows.

With reference now to FIG. 1A, illustrated therein is a plot 100 showing calculated optical loss (dB/cm) as a function of wavelength (µm) in $In_{0.53}Ga_{0.47}As$ (solid curves) and InP (dashed curves) materials for electron concentrations (indicated using dashed ovals) of $1 \times 10^{14}$ cm$^{-3}$, $1 \times 10^{15}$ cm$^{-3}$, and $5 \times 10^{15}$ cm$^{-3}$, in accordance with some embodiments. The data shown in the plot 100 indicates that propagation losses below 1 dB/cm (absorption coefficient below 0.2 cm$^{-1}$) may be achieved in $In_{0.53}Ga_{0.47}As/InP$ passive waveguides for wavelength ranges between 3 µm and 12 µm, assuming a free electron concentration of about $1 \times 10^{14}$ cm$^{-3}$. Such a loss is comparable to results achieved in silicon-on-insulator (SOI) and silicon-on-sapphire (SOS) platforms in the MWIR region (e.g., 0.6 dB/cm at 3.4 µm in SOI and 0.74 dB/cm at 4.5 µm in SOS).

In the MWIR range ($\lambda \approx 3$-5 µm), as shown in the plot 100, the calculated optical loss in $In_{0.53}Ga_{0.47}As$ and InP remains well below 1.5 dB/cm even if the free electron concentration is as high as $5 \times 10^{15}$ cm$^{-3}$. Such a doping level enables retention of sufficient electrical conductivity in the passive waveguide layer, as illustrated in the plot 150 of FIG. 1B (which shows resistivity and resistance as a function of electron concentration), to extract current from the QCL active region through the passive layers. Experimental data, which demonstrates such device properties, is shown and discussed in more detail below. Thus, in various embodiments and in contrast to QCLs on Si which may require lateral current injection, III-V mid-IR QCL PIC devices (disclosed herein), may be processed in substantially the same manner as regular high-power mid-IR QCLs. It is noted that the resistance data shown in the plot 150 includes in-series resistance data for a 1 µm thick layer of InP and $In_{0.53}Ga_{0.47}As$ materials integrated beneath a QCL active region. Further, the data shown in the plot 150 is calculated assuming a QCL ridge waveguide having a width equal to about 6 µm and a length equal to about 4 mm.

Figure 2A:
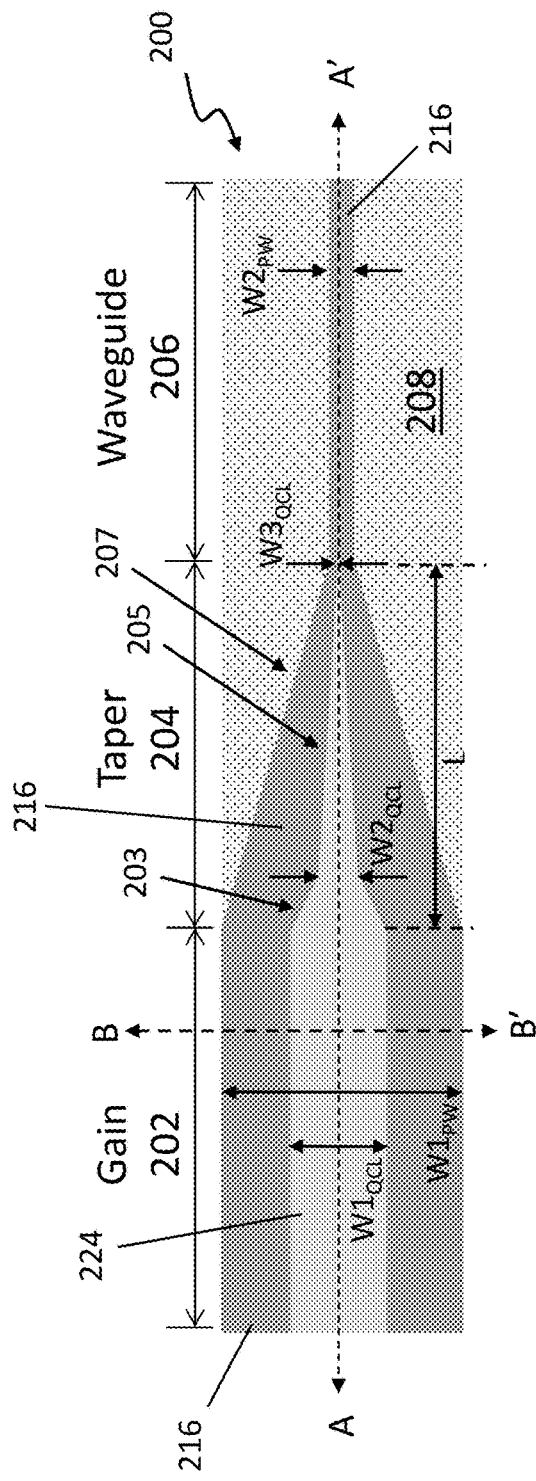
FIG. 2A shows a top-down view of an exemplary mid-infrared (mid-IR) photonic integrated circuit (PIC) device, in accordance with some embodiments.
Figure 2B:
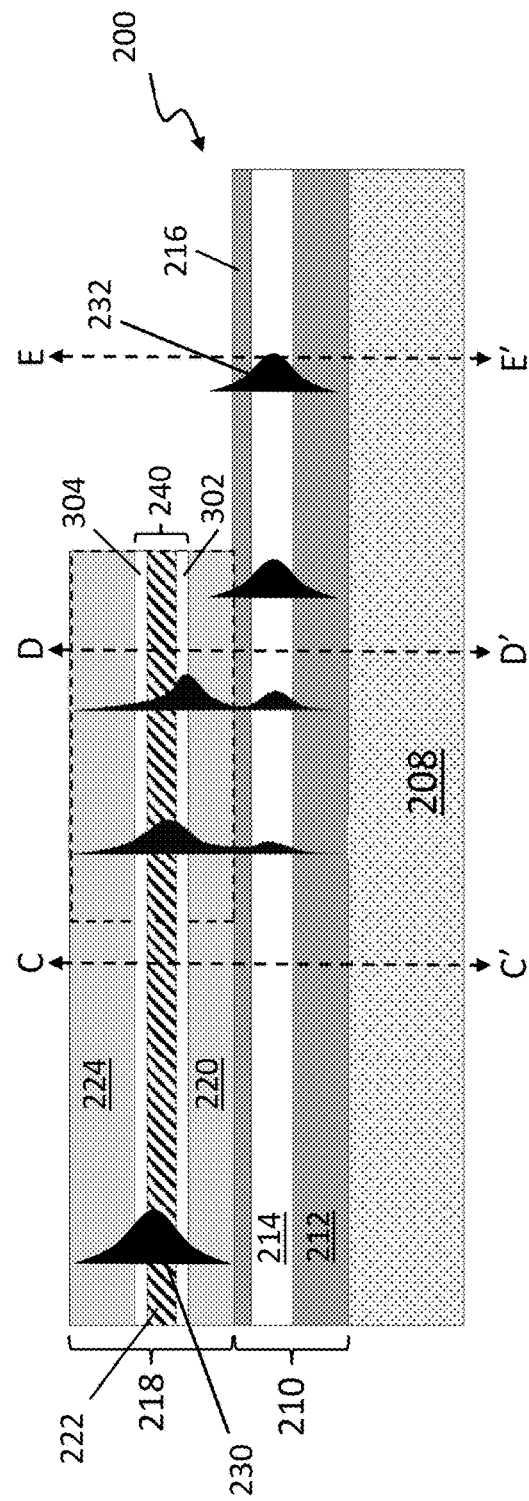
FIG. 2B shows a cross-sectional view along a section A-A' of the exemplary mid-IR PIC device of FIG. 2A, according to some embodiments.

Referring to FIGS. 2A and 2B, illustrated therein is an exemplary mid-IR PIC device 200, in accordance with some embodiments. In particular, FIG. 2A shows a top-down view of the device 200 and FIG. 2B provides a cross-sectional view along a section A-A' shown in FIG. 2A. In various embodiments, the device 200 includes a QCL gain section 202, a taper section 204, and a passive waveguide (WG) section 206 (e.g., such as an $In_{0.53}Ga_{0.47}As$ passive waveguide section). By way of example, a QCL heterostructure of the device 200 includes a first QCL ridge width '$W1_{QCL}$'. In various embodiments, the first QCL ridge width '$W1_{QCL}$' narrows (within the taper section 204) to a second QCL ridge width '$W2_{QCL}$' along a first taper step 203 and to a third QCL ridge width '$W3_{QCL}$' along a second taper step 205. In other embodiments, narrowing of the first QCL ridge width '$W1_{QCL}$' to the third QCL ridge width '$W3_{QCL}$' (within the taper section 204) may be accomplished by using a single taper step or by using more than two taper steps. The taper section 204 may also define a taper length 'L'. It is noted that the QCL heterostructure spans the QCL gain section 202 and the taper section 204 but is absent from the passive waveguide section 206. In addition, a passive waveguide heterostructures of the device 200 includes a first passive waveguide ridge width '$W1_{PW}$' and a second passive waveguide ridge width '$W2_{PW}$', where the first passive waveguide ridge width '$W1_{PW}$' narrows (within the taper section 204) to the second passive waveguide ridge width '$W2_{PW}$' along a taper step 207. In some embodiments, narrowing of the first passive waveguide ridge width '$W1_{PW}$' to the second passive waveguide ridge width '$W2_{PW}$' (within the taper section 204) may alternatively be accomplished by using two or more taper steps. In various embodiments, the passive waveguide heterostructure spans the QCL gain section 202, the taper section 204, and the passive waveguide section 206. In at least some examples, tapering of both the QCL heterostructure and the passive waveguide heterostructure may be performed to improve coupling efficiency, for example, by increasing an interaction length along which effective indices of a QCL mode and a passive waveguide mode match (as discussed below with reference to FIG. 8) within the taper section 204. Also, it is noted that the taper section 204 is substantially aligned to the QCL gain section 202 and to the passive waveguide section 206 (e.g., along section A-A' of FIG. 2A).

As shown, the device 200 includes a substrate 208. In some embodiments, the substrate 208 includes a doped InP substrate (e.g., InP doped with sulfur with a concentration between about $1 \times 10^{16}$ cm$^{-3}$ and $1 \times 10^{19}$ cm$^{-3}$), upon which various epitaxial QCL and passive waveguide layers (discussed below) are formed using a metal-organic vapor phase epitaxy (MOVPE) process, a metal-organic chemical vapor deposition (MOCVD) process, a molecular beam epitaxy (MBE) process, or other suitable epitaxial semiconductor growth process. In at least one embodiment, the substrate 208 may be doped to a concentration of about $1 \times 10^{17}$ cm$^{-3}$ and may have a thickness of about 350 µm.

More generally, and in some embodiments, the substrate 208 may be a semiconductor substrate including another type of semiconductor such as GaAs, GaP, GaSb, InAs, InSb, or other appropriate substrate. The substrate 208 may include various layers, including conductive or insulating layers formed on the substrate 208. The substrate 208 may include various doping configurations depending on design requirements as is known in the art. For example, different doping profiles (e.g., n-type or p-type doping) may be formed on the substrate 208 in regions designed for different device types. The different doping profiles may include ion implantation of dopants and/or diffusion processes. In some embodiments, the substrate 208 includes isolation features (e.g., regions with low or substantially no current conductivity) interposing the regions providing different device types. Further, the substrate 208 may optionally include one or more epitaxial layers, may be strained for performance enhancement, may include a silicon-on-insulator (SOI) structure, and/or have other suitable enhancement features.

In various embodiments, a passive waveguide heterostructure 210 is initially grown over the substrate 208. The passive waveguide heterostructure 210 may include a lower passive waveguide cladding layer 212 formed over the substrate 208, a passive waveguide core 214 formed over the lower passive waveguide cladding layer 212, and an upper passive waveguide cladding layer 216 formed over the passive waveguide core 214. In some embodiments, the lower passive waveguide cladding layer 212 includes an undoped InP passive lower cladding layer. In at least one example, the lower passive waveguide cladding layer 212 has a thickness of about 3000 nm and a refractive index of about 3.08. In some embodiments, the lower passive waveguide cladding layer 212 has a thickness in a range of about 2000-4000 nm. The passive waveguide core 214 may include an $In_{0.53}Ga_{0.47}As$ passive waveguide core. In an example, the passive waveguide core 214 has a thickness of about 750 nm and a refractive index of about 3.38. In some embodiments, the passive waveguide core 214 has a thickness in a range of about 500-900 nm. In some cases, the upper passive waveguide cladding layer 216 may include an undoped InP passive upper cladding layer. In one example, the upper passive waveguide cladding layer 216 has a thickness of about 1500 nm and a refractive index of about 3.08. In some embodiments, the upper passive waveguide cladding layer 216 has a thickness in a range of about 1000-1500 nm. Thus, in some examples, the lower passive waveguide cladding layer 212 and the upper passive waveguide cladding layer 216 may have substantially the same refractive index, and a lower refractive index than the passive waveguide core 214. Stated another way, the passive waveguide core 214 has a first volume-averaged refractive index, the upper passive waveguide cladding layer 216 has a second volume-averaged refractive index, and the lower passive waveguide cladding layer 212 has a third volume-averaged refractive index, where the first volume-averaged refractive index is greater than both the second volume-averaged refractive index and the third volume-averaged refractive index. Because of the differences in the indices of refraction, the lower and upper passive waveguide cladding layers 212, 216 help provide optical confinement within the passive waveguide core 214.

While some examples of layer compositions for the passive waveguide heterostructure 210 have been described, it will be understood that other materials may be equally used without departing from the scope of the present disclosure. For example, in some embodiments, the passive waveguide heterostructure 210 may alternatively include InGaAsP, InGaAs/AlInAs multi-quantum wells, or an InGaAs/AlInAs superlattice. Further, in various embodiments, the terms "passive waveguide" or "passive waveguide heterostructure" may include any of a plurality of material systems configured to guide light along a particular direction, for example, by utilizing a waveguide core layer surrounded by cladding layers having a lower index of refraction than the waveguide core layer.

Figure 3:
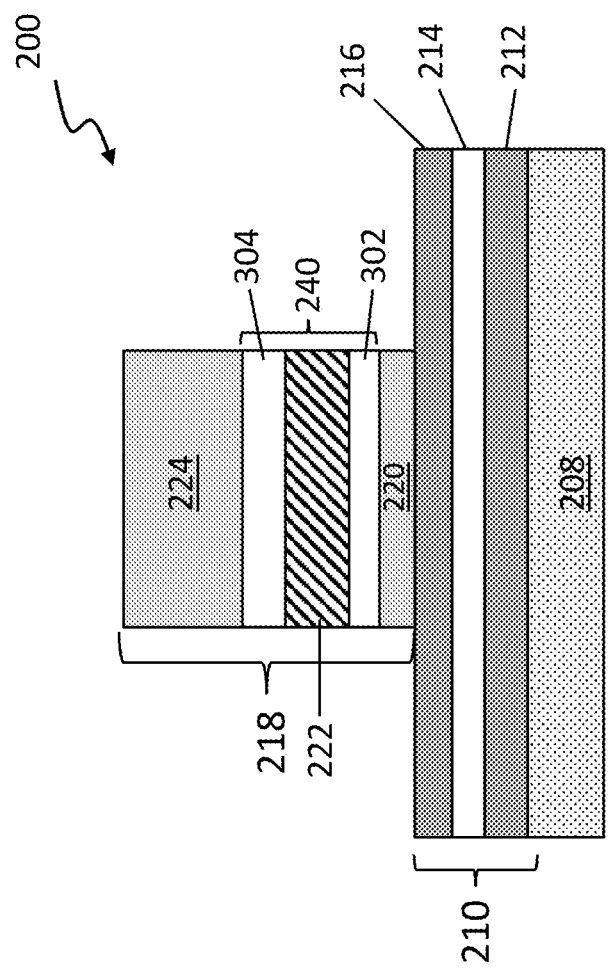
FIG. 3 shows a cross-sectional view along a section B-B' of the exemplary mid-IR PIC device of FIG. 2A and illustrating first and second confinement layers, according to some embodiments.

After formation of the passive waveguide heterostructure 210, a QCL heterostructure 218 is formed over the passive waveguide heterostructure 210. The QCL heterostructure 218 may include a lower cladding layer 220 formed over the upper passive waveguide cladding layer 216 (of the passive waveguide heterostructure 210), a QCL core layer 240 formed over the lower cladding layer 220, and an upper cladding layer 224 formed over the QCL core layer 240. In some embodiments, the QCL core layer 240 may include a lower confinement layer 302, a QCL active region 222 that provides QCL gain, and an upper confinement layer 304. FIG. 3 provides a cross-sectional view of the device 200 along a section B-B' shown in FIG. 2A, illustrating an alternative view of the QCL core layer 240 and the lower and upper confinement layer 302, 304. In various embodiments, the lower confinement layer 302 and the upper confinement layer 304 provide high refractive index layers around the QCL active region 222, which are key to enabling efficient lasing operation of the device 200.

In some embodiments, the lower cladding layer 220 includes an InP lower cladding layer doped to $2 \times 10^{16}$ cm$^{-3}$ (e.g., with Si). In at least one example, the lower cladding layer 220 has a thickness of about 300 nm and a refractive index of about 3.08. In some embodiments, the lower cladding layer 220 has a thickness in a range of about 200-400 nm. The lower confinement layer 302 may include an $In_{0.53}Ga_{0.47}As$ layer. In some embodiments, the lower confinement layer 302 has a thickness of about 350 nm and a refractive index of about 3.38. In some embodiments, the lower confinement layer 302 has a thickness in a range of about 150-400 nm. In some examples, the lower confinement layer 302 may be doped to about $2 \times 10^{16}$ cm$^{-3}$ (e.g., with Si). In various embodiments, the QCL active region 222 is composed of a plurality (e.g., 30) of strain-compensated InGaAs/AlInAs QCL stage layers configured to provide an emission wavelength of about 4.6 µm. The QCL active region 222 may also be doped to an average doping level of $1.8 \times 10^{16}$ cm$^{-3}$. In an example, the QCL active region 222 has a thickness of about 1660 nm and a refractive index of about 3.26. In some embodiments, the QCL active region 222 has a thickness in a range of about 1200-1800 nm. In some cases, the upper confinement layer 304 may include an $In_{0.53}Ga_{0.47}As$ layer. In some embodiments, the upper confinement layer 304 has a thickness of about 500 nm and a refractive index of about 3.38. In some embodiments, the upper confinement layer 304 has a thickness in a range of about 250-600 nm. Thus, in some examples, the lower confinement layer 302 and the upper confinement layer 304 may have substantially the same refractive index, and a larger refractive index than the QCL active region 222. In another example, the upper confinement layer 304 has a thickness of about 350 nm. In some examples, the upper confinement layer 304 may be doped to about $2 \times 10^{16}$ cm$^{-3}$ (e.g., with Si). In some examples, the upper cladding layer 224 includes an InP upper cladding layer doped to $5 \times 10^{16}$ cm$^{-3}$ (e.g., with Si). In at least one example, the upper cladding layer 224 has a thickness of about 2700 nm and a refractive index of about 3.08.

Figure 4:
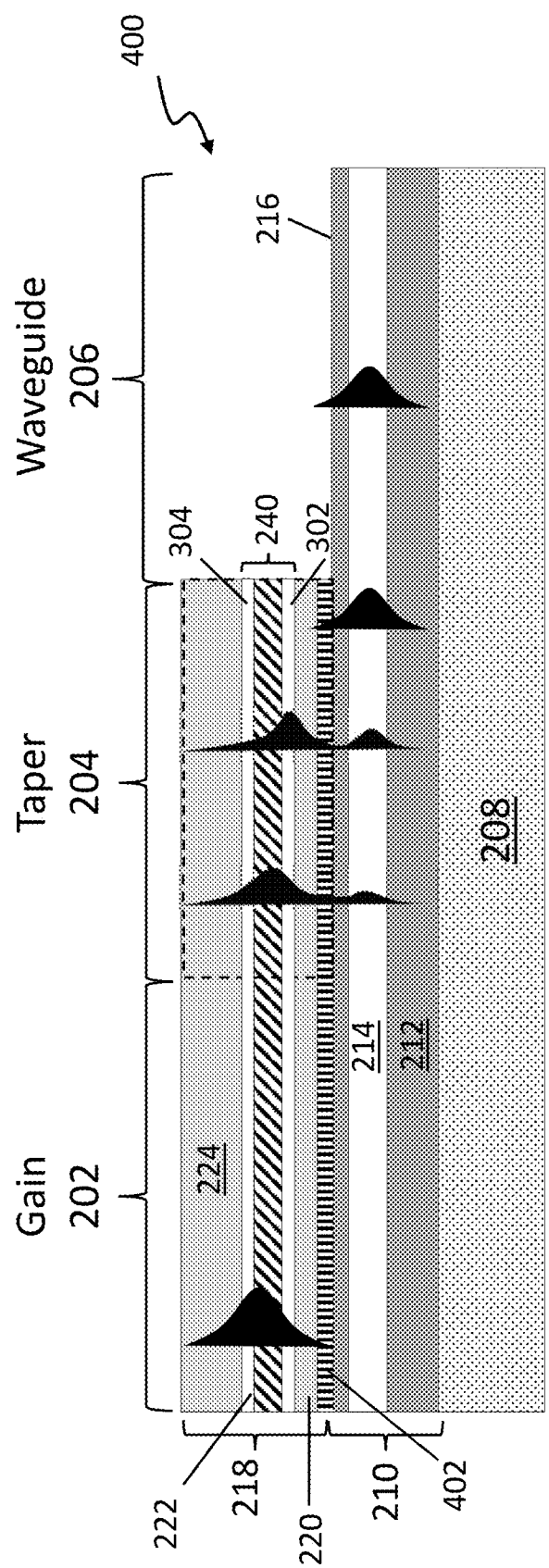
FIG. 4 shows a cross-sectional view of another exemplary mid-IR PIC device including a current injection layer, according to some embodiments.

In some cases, and as shown in device 400 of FIG. 4, a current injection layer 402 may optionally be formed between the upper passive waveguide cladding layer 216 and the lower cladding layer 220. In some embodiments, the current injection layer includes $In_{0.53}Ga_{0.47}As$. In at least one example, the current injection layer 402 may have a thickness of about 200 nm and may be doped to about $1\times10^{18}$ cm$^{-3}$ (e.g., with Si). In some embodiments, the current injection layer 402 has a thickness in a range of about 100-300 nm. For each of the devices 200 and 400, and in some embodiments, an InP outer cladding layer may be formed over the upper cladding layer 224, and a contact layer including InP or $In_{0.53}Ga_{0.47}As$ may be formed over the outer cladding layer, as shown in the example of FIGS. 10A and 10B. In an example, the InP outer cladding layer has a thickness of about 150 nm and is doped to about $2\times10^{17}$ cm$^{-3}$ (e.g., with Si). In some embodiments, the InP outer cladding layer has a thickness in a range of about 150-2000 nm. In some embodiments, the InP contact layer may have a thickness of about 200 nm and may be doped to about $5\times10^{18}$ cm$^{-3}$ (e.g., with Si). While some examples of layer compositions and thicknesses for each of the passive waveguide heterostructure 210, the QCL heterostructure 218, the optional current injection layer 402, and the outer cladding and contact layers have been described, those of skill in the art in possession of the present disclosure will recognize other layer compositions and thicknesses which may also be used without departing from the scope of this disclosure.

After growth of the material layers used to form the passive waveguide heterostructure 210 and the QCL heterostructure 218, fabrication steps for the devices 200, 400 may be substantially similar to those used for conventional ridge waveguide QCLs. For example, a patterned silicon nitride hard mask may be formed over the grown layers and used to define the QCL gain section 202 and the taper section 204 using a dry etching process through the patterned hard mask. In an embodiment, QCL ridge etching may be stopped at the middle of the lower cladding layer 220. In some cases, another patterned hard mask may be formed and used to define the passive waveguide section 206 using another dry etching process through the patterned hard mask. In an embodiment, waveguide ridge etching may be stopped 200 nm below the $In_{0.53}Ga_{0.47}As$ passive waveguide core layer 214. The sidewalls of the QCL gain section 202 may be insulated using a 400-nm-thick layer of silicon nitride. Thereafter, in some embodiments, top and bottom contacts may be formed by e-beam evaporation of Ti/Au (20 nm/400 nm) layers followed by a lift-off process. In embodiments including the optional current injection layer 402, a Ti/Au side contact may also be formed. In some cases, the remaining silicon nitride layer on top of the passive waveguide may be removed by a reactive ion etching process.

With respect to device operation and referring again to the example of FIGS. 2A and 2B, mid-IR radiation may be generated in the QCL gain section 202, upon appropriate biasing of the device 200, and a corresponding laser mode 230 propagates into the taper section 204 where the laser mode is coupled to a passive waveguide mode 232 of the passive waveguide section 206. Generally, the highest output power at facets of the waveguide section 206 may be achieved by maximizing modal gain in the QCL gain section 202 and coupling efficiency in the taper section 204. In some cases, such a process may in some cases involve iterative optimization of the QCL heterostructure 218, the passive waveguide heterostructure 210, and the taper dimensions of the taper section 204. It is also noted that in some respects, the devices disclosed herein (e.g., such as the devices 200, 400) may be viewed as double-waveguide heterostructures including a first waveguide core (e.g., the QCL active region 222) and a second waveguide core (e.g., the $In_{0.53}Ga_{0.47}As$ passive waveguide core layer 214) that are vertically separated from each other by one or more cladding layers (e.g., such as the upper passive waveguide cladding layer 216 and the lower cladding layer 220), as discussed above.

In order to achieve low-threshold operation of the QCLs on the III-v PIC platform disclosed herein at or near room temperature, as well as efficient optical power coupling from the QCL to the passive waveguides, a careful balance between the thicknesses of the QCL active region 222 and the passive $In_{0.53}Ga_{0.47}As$ waveguide core 214 should be provided. In particular, because the refractive index of the undoped $In_{0.53}Ga_{0.47}As$ waveguide core 214 (about 3.38 at the 4.6 μm emission wavelength of the QCL) is larger than that of the QCL active region 222 (about 3.26 at the 4.6 μm emission wavelength of the QCL), a choice of a thick passive waveguide core 214 layer of the passive $In_{0.53}Ga_{0.47}As$ waveguide can cause significant modal leakage in the QCL gain section 202, which can lead to high threshold current density of the laser or prevent laser operation. On the other hand, making the passive waveguide core 214 thickness too thin reduces the taper coupling efficiency (e.g., in the taper section 204) as the effective refractive indexes of the QCL and waveguide modes become too different from one another. In some embodiments, and to keep the laser mode confined in the QCL gain section 202, the effective refractive index of an InGaAs waveguide mode below the QCL gain section 202 should be lower than that of a QCL mode in the QCL gain section 202. The passive waveguide cladding layer thicknesses between the QCL active region 222 and the passive InGaAs waveguide core 214 should also be chosen to provide both high QCL mode confinement in the QCL gain section 202 and high coupling efficiency in the taper section 204. Further, and as noted above, providing the higher refractive index layer (the lower confinement layer 302 and the upper confinement layer 304) around the QCL active region 222 enable efficient lasing operation of the device 200.

Elaborating on mode confinement, and with reference to FIG. 5A, illustrated therein is a plot 500 of mode confinement factor (%) in the QCL active region 222 (square symbols) and in the passive waveguide core 214 (circular symbols) for different values of the $In_{0.53}Ga_{0.47}As$ passive waveguide core 214 thickness. The results are shown for a $TM_{00}$ mode and are obtained using COMSOL® simulations. For purposes of the simulation data of FIGS. 5A-5D, the composition and thickness of all device layers, except for the passive waveguide core 214, are assumed to be the same. Various other embodiments of the layer compositions and thicknesses of the device 200 have been previously described above. As shown in FIG. 5A, the QCL active region 222 confinement is maintained at around 60% until the passive waveguide core 214 thickness exceeds about 850 nm, and above that thickness the QCL active region 222 confinement quickly drops. An opposite trend is observed with the fundamental $TM_{00}$ mode confinement in the $In_{0.53}Ga_{0.47}As$ passive waveguide core 214. Based on the data of FIG. 5A, it is evident that a thickness of about 750 nm for the passive waveguide core 214 (as discussed above in reference to the device 200) ensures high mode confinement in the QCL active region 222 of the QCL gain section 202. In some embodiments, and in accordance with the data of FIG. 5A, the passive waveguide core 214 may have a thickness of between 750-850 nm, while maintaining high mode confinement in the QCL active region 222. FIGS. 5B, 5C, and 5D illustrate cross-sectional profiles of the simulated fundamental mode for passive waveguide core 214 thicknesses of 750 nm, 1000 nm, and 1200 nm, respectively, which further underscore the data of FIG. 5A. In some embodiments, FIGS. 5B, 5C, and 5D provide the cross-sectional profile along a section C-C' of FIG. 2B.

In various embodiments of the QCL core layer 240, the lower confinement layer 302 and the upper confinement layer 304 disposed beneath and above the QCL active region 222 of the disclosed devices may also serve to improve mode confinement in the QCL active region 222, as illustrated in the examples of FIGS. 6A, 6B, 7A, and 7B. FIGS. 6A and 7A provide cross-sectional views along a section substantially similar to section B-B' of FIG. 2A. In particular, FIG. 6A shows a device 600 including the passive waveguide heterostructure 210 and the QCL heterostructure 218, similar to the structures described above, but not including the lower confinement layer 302 or the upper confinement layer 304 in the QCL core layer 240. In this case, the QCL core layer 240 only includes the QCL active region 222. FIG. 7A shows a device 700, substantially similar to the device 200 of FIG. 3, and including the passive waveguide heterostructure 210, the QCL heterostructure 218, and the lower confinement layer 302 and the upper confinement layer 304 around the QCL active region 222 in the QCL core layer 240.

FIG. 6B shows a cross-sectional profile of the simulated mode confinement, corresponding to the device 600 of FIG. 6A, within the QCL gain section 202 and along a section substantially similar to the section C-C' of FIG. 2B. FIG. 7B shows a cross-sectional profile of the simulated mode confinement, corresponding to the device 700 of FIG. 7A, within the QCL gain section 202 and also along a section substantially similar to the section C-C' of FIG. 2B. For the device 600, not including the lower confinement layer 302 or the upper confinement layer 304, the mode confinement factor in the QCL active region 222 may be equal to about 16.82% and the mode confinement factor in the passive waveguide core 214 may be equal to about 34.11%, which indicates significant modal leakage in the QCL gain section 202. For the device 700, which includes the lower confinement layer 302 and the upper confinement layer 304, the mode confinement factor in the QCL active region 222 may be equal to about 65.07% and the mode confinement factor in the passive waveguide core 214 may be equal to about 0.65%. Thus, the confinement layers 302, 304 may be used to effectively mitigate modal leakage, and ensure high mode confinement, in the QCL active region 222 of the QCL gain section 202.

Figure 8:
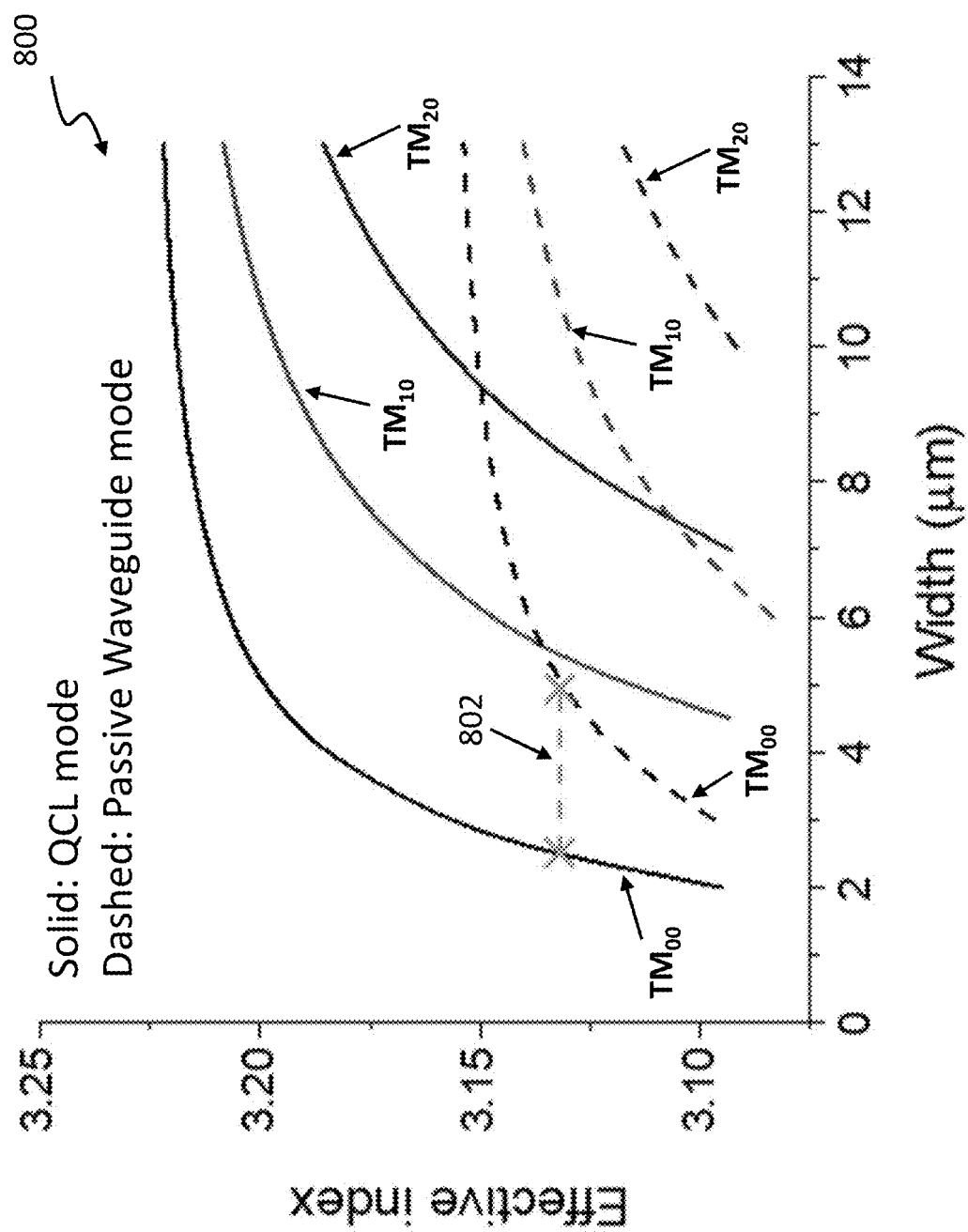
FIG. 8 illustrates a plot showing effective refractive indices of QCL waveguide modes and the passive waveguide modes as a function of ridge width, in accordance with some embodiments.

With respect to mode coupling, mode coupling (e.g., in the taper section 204) from the QCL gain section 202 to the $In_{0.53}Ga_{0.47}As$ passive waveguide section 206 occurs when the effective refractive indices of the modes confined in the two sections (the QCL gain section 202 and the passive waveguide section 206) are substantially matched. In some embodiments, increasing the interaction length (e.g., within the taper section 204) for coupling near the index matching point may provide enhanced mode coupling efficiency. In some examples, to find the QCL ridge width that provides the modal refractive index matching to the mode in the passive $In_{0.53}Ga_{0.47}As$ waveguide, separate QCL and $In_{0.53}Ga_{0.47}As$ waveguide heterostructures having different ridge widths may be simulated and analyzed. The simulation results may provide reference waveguide widths to initiate and optimize the taper design (e.g., of both the QCL heterostructure and the passive waveguide heterostructure). With reference to FIG. 8, illustrated therein is a plot 800 showing effective refractive indices of the QCL waveguide modes (solid lines) and the passive $In_{0.53}Ga_{0.47}As$ waveguide modes (dashed lines) as a function of ridge width (e.g., QCL ridge width and passive waveguide ridge width). In particular, the plot 800 shows the effective indices of the $TM_{00}$ mode in the QCL ridge waveguide and of the $TM_{00}$ mode in the passive $In_{0.53}Ga_{0.47}As$ ridge waveguide. As shown, when the QCL ridge width is about 2.5 µm and the passive waveguide ridge width is about 5 µm, the effective indices of the fundamental $TM_{00}$ modes of the two waveguides are found to be matching, as indicated by line 802. In various embodiments and given the aim to achieve a single spatial mode operation of the PIC device 200, both waveguides (e.g., of the QCL heterostructure and the passive waveguide heterostructure) should be designed to confine fundamental modes. In addition, and as previously discussed, tapering of both the QCL heterostructure and the passive waveguide heterostructure may be performed (as shown in FIG. 2A). As such, and with consideration of the data of FIG. 8, the taper of each of the QCL ridge width and the passive waveguide ridge width may in some embodiments be designed to increase the length (within the taper section 204) along which the effective indices of the fundamental $TM_{00}$ modes of the two waveguides are found to be matching.

Referring now to FIGS. 9A, 9B, 9C, and 9D, illustrated therein are simulation results for a transverse mode (TM) transition (FIG. 9A) of a $TM_{00}$ QCL mode to a $TM_{00}$ waveguide mode along the section A-A' shown in FIG. 2A, as well as the cross-sectional profiles of the simulated mode confinement at each of the QCL gain section 202 (FIG. 9B), the taper section 204 (FIG. 9C), and the passive waveguide section 206 (FIG. 9D). In particular, FIG. 9B provides the cross-sectional profile along a section C-C' of FIG. 2B, FIG. 9C provides the cross-sectional profile along a section D-D' of FIG. 2B, and FIG. 9D provides the cross-sectional profile along a section E-E' of FIG. 2B. The three-dimensional eigenmode simulations of FIGS. 9A-9D were generated using a finite element method simulation tool (MODE Solutions developed by Lumerical Inc. of Vancouver, BC, Canada) to estimate the taper coupling efficiency, which is defined as the ratio of optical power in the waveguide section 206 to optical power in the QCL gain section 202 of the device 200.

As previously discussed, the taper design of the taper section 204 uses two tapering steps, the first taper step 203 and the second taper step 205, as shown in FIG. 2A. The first taper step 203 quickly decreases the effective refractive index of the QCL mode to a value that is close to that of the passive waveguide mode, while the second taper step 205 provides a relatively large interaction length near the index matching point, discussed above, for efficient adiabatic mode transition within the taper section 204. In some embodiments, the taper shape (e.g., of the QCL heterostructure in the taper section 204) may be expressed as:

$$W_{hf}(x) = W_{hf-e} + (W_{hf-i} - W_{hf-e})\left(1 - \frac{x}{L}\right)^a,$$

where x is the propagation direction, $W_{hf}$ is the half width of the taper at x, $W_{hf-i}$ and $W_{hf-e}$ are the initial and end half width of the taper, respectively, L is the taper length, and a is the nonlinear factor. In an embodiment of the device 200 including a QCL ridge width of 6 μm (e.g., the first QCL ridge width 'W1$_{QCL}$' of FIG. 2A), the two-step linear (α=1) taper may include the first linear taper step 203 having a length of about 0.1 mm with the QCL ridge width changing from 6 μm to 5 μm (e.g., the second QCL ridge width 'W2$_{QCL}$' of FIG. 2A), and the second linear taper step 205 having a length of about 0.9 mm with the QCL ridge width changing from 5 μm to 1.75 μm (e.g., the third QCL ridge width 'W3$_{QCL}$' of FIG. 2A). The three-dimensional eigenmode simulation shown in FIG. 9A, where the simulation is performed utilizing the above taper geometry and layer thicknesses and compositions described above, indicates that such a taper may provide a coupling efficiency of about 72% for the device 200. In some cases, higher efficiency may be achieved by increasing the thickness of the passive waveguide layer 214 and further optimizing the taper dimensions. In at least one embodiment, the adiabatic taper of the passive waveguide heterostructure 210, within the taper section 204, is about 1 mm long and has a width that tapers from about 30 microns to about 5 microns.

Devices (e.g., such as the devices 200, 400, 700) fabricated in accordance to the various embodiments discussed above may be mounted epitaxial-side-up (epi-up) on copper blocks using indium solder for electrical and optical characterizations. With reference to FIGS. 10A and 10B, illustrated therein is a device 1000 and a device 1002, respectively, which show biasing configurations for device characterization. The devices 1000, 1002 may in various aspects be substantially similar to the devices 200, 400, 700 discussed above. For example, each of the devices 1000, 1002 includes the passive waveguide heterostructure 210, the QCL heterostructure 218, the QCL core layer 240, as well as other layers previously described. The devices 1000, 1002 are further shown to include the optional current injection layer 402. However, other embodiments may not include the current injection layer 402. The devices 1000, 1002 also illustrate a silicon nitride layer 1004, which as discussed above, may be used to insulate sidewalls of the QCL gain section 202. In some embodiments, the devices 1000, 1002 may also include an outer cladding layer and a contact layer, as discussed above, and illustrated as layer 1011. In addition, each of the devices 1000, 1002 may include one or more metal layers 1006 (e.g., such as Ti/Au) that may be used to form a top contact 1008, a bottom contact 1010, and a side contact 1012 (for embodiments including the optional current injection layer 402).

During operation, the devices 1000, 1002 are negatively biased at the top contact 1008, while current is injected either through the substrate (via the bottom contact 1010) or through the current injection layer (if present, via the side contact 1012). For purposes of this example, fabricated devices were tested in pulsed mode with 50-ns current pulses at 50 kHz repetition frequency. Lasing spectra were measured using a Fourier-transform infrared spectrometer equipped with a deuterate-triglycine sulfate detector and a potassium bromide beam splitter. Output power of the devices was collected with a 7-mm-diameter polished metal pipe and directed to a calibrated thermopile detector. In the present example, 100% power collection efficiency in the measurement setup is assumed. All measurements were performed at room temperature.

Figures 11A, 11B, 11C:
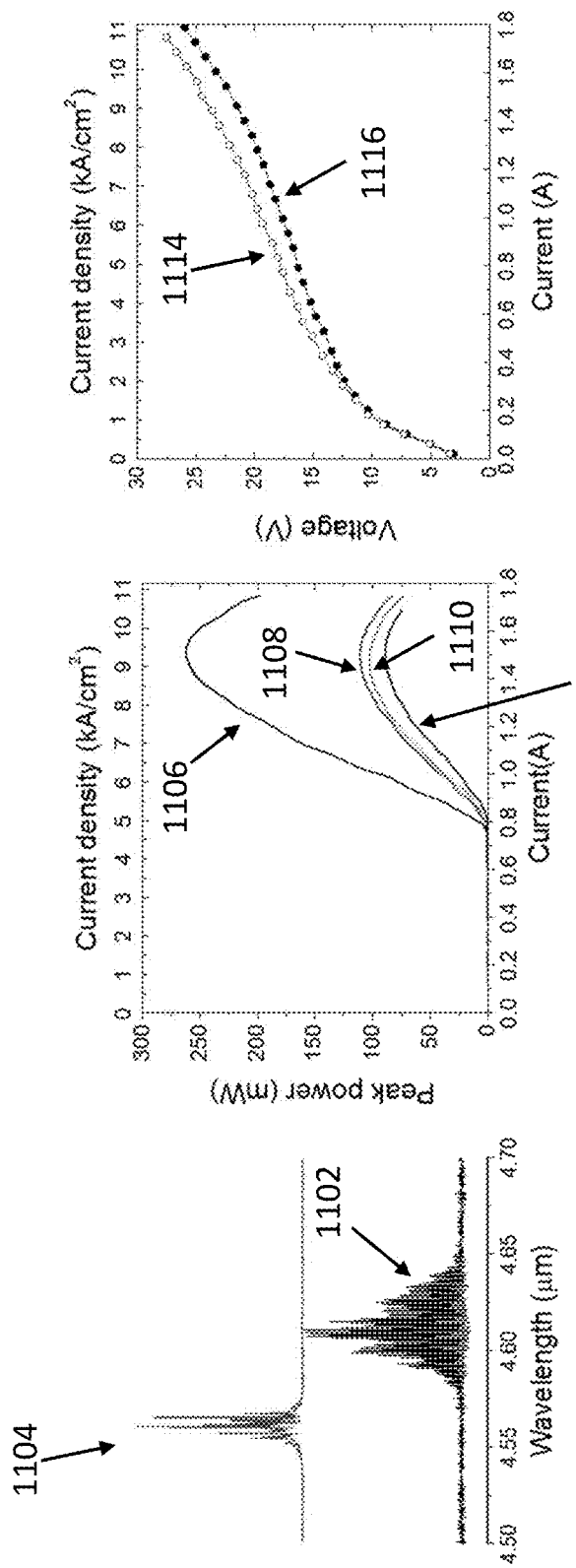
FIGS. 11A, 11B, and 11C illustrate measurement results for a reference device and a waveguide-coupled device, according to some embodiments.

Referring now to FIGS. 11A, 11B, and 11C, illustrated therein are measurement results for a reference device (which includes only the QCL gain section 202 with cleaved facets) and a waveguide-coupled device (including the QCL gain section 202, the taper section 204, and the waveguide section 206, such as shown and described with reference to the device 200). In the present example, the reference device has a cavity length (e.g., QCL gain section 202 length) of 3.75-mm and a QCL ridge width of 4.3 μm (W1$_{QCL}$). The waveguide-coupled devices have a QCL ridge width of 4.3 μm (W1$_{QCL}$), a QCL gain section 202 length of 3.75 mm, a 1-mm-long taper section 204, and 5-μm-wide passive waveguides (e.g., passive waveguide ridge width, W2$_{PW}$) of different lengths. FIG. 11A shows a first measured spectrum 1102 of the reference device and a second measured spectrum 1104 of the waveguide-coupled device. The waveguide-coupled device generating the spectrum 1104 has a passive waveguide length of 6.5 mm. The devices were observed to emit near 4.6 μm wavelength, as designed. FIG. 11B shows light-current characteristics of the reference device (1106) and waveguide-coupled devices having passive waveguides of different lengths: 6.5 mm (1108), 9.5 mm (1110), and 11 mm (1112). Output power of the waveguide-coupled QCLs devices was measured from the passive waveguide facets. The output power for each of the waveguide-coupled QCL devices at the roll over (peak) points are 110 mW, 103 mW, and 89 mW for the devices with the waveguide lengths of 6.5 mm (1108), 9.5 mm (1110), and 11 mm (1112), respectively, while the reference device (1106) has a roll over power of 262 mW.

It is noted that undercut during dry etching may impact as-fabricated device dimensions. In the present case, undercut during dry etching results in the 1.7 μm narrower-than-designed width of the QCL and taper sections (e.g., QCL ridge width of 4.3 μm instead of 6 μm, as discussed above). The variation of the dimension due to such undercutting may reduce the coupling efficiency of the taper section 204 from about 72% (estimated by the eigenmode simulation, previously discussed) to about 50%. By mitigating such issues, and fabricating QCL and taper sections with as-designed dimensions (e.g., as-designed widths), experimental device performance is expected to significantly improve.

The current density shown in FIG. 11B may be estimated by dividing bias current by the area of the QCL gain section 202 (e.g., ridge width×cavity length) which is identical for the reference device and the waveguide-coupled devices, assuming current spreading to the taper section is negligible. In the present example, the threshold current densities ($J_{th}$) of the waveguide-coupled devices increase as the passive waveguide length increases. About a 10% increase in $J_{th}$ is observed for the 11-mm-long (1112) waveguide-coupled device, compared to $J_{th}$ of the reference (1106) device (4.86 kA/cm$^2$). As shown in FIG. 11B, both the reference and waveguide-coupled devices reach a maximum power output at a pump current density of approximately 9.4 kA/cm$^2$, indicating that the current spreading from the QCL gain section 202 to the taper section 204 in the waveguide-coupled devices is indeed negligible.

Similar power output (FIG. 11B) of the waveguide-coupled devices with different passive waveguide lengths (6.5 mm, 9.5 mm, and 11 mm) confirms low optical loss in the passive waveguides (e.g., in the passive waveguide section 206). The power output of the waveguide-coupled device with the 11-mm-long (1112) waveguide section was only 20% lower than that of the device with 6.5-mm-long (1108) passive waveguide. Assuming that such power reduction originates from the waveguide length difference, it may be estimated that the passive waveguide loss for devices fabricated in accordance with the various embodiments disclosed herein is about ~2.2 dB/cm.

One of the advantages of the III-V homogeneous photonic integration approach, described herein, is that the lasers may be biased through the doped substrate similar to conventional QCLs. With reference to FIG. 11C, illustrated therein are voltage-current characteristics for the same reference device measured according to different bias configurations (shown in FIGS. 10A and 10B). For example, a curve 1114 shows the voltage-current characteristics for the reference device biased according to a top-bottom bias configuration (FIG. 10B), and a curve 1116 shows the voltage-current characteristics for the same reference device biased according to a top-side-bottom bias configuration (FIG. 10A). In the present example, the device with the top-bottom configuration (curve 1114) produced an additional series resistance of approximately 1.33Ω, compared to the device with both bottom and lateral current injection (curve 1116). It is noted that the resistance of the lateral current injection layer 402 is estimated to be less than 0.1Ω, much smaller than the resistance of the undoped passive waveguide layers in the top-bottom biased device (curve 1114). Thus, the series resistance of the top-side-bottom biased device (curve 1116) is principally determined by the small (<0.005Ω) resistance of the current injection layer 402. In some embodiments, and assuming that the background doping level of the undoped passive waveguide layers is about $3 \times 10^{15}$ cm$^{-3}$, the resistivity values of $In_{0.53}Ga_{0.47}As$ and InP may be estimated (e.g., from FIG. 1B) to be about 0.22 Ω·cm and 0.463 Ω·cm, respectively. In an example, assuming the thicknesses (t) of the undoped $In_{0.53}Ga_{0.47}As$ and InP passive waveguide layers to be, respectively, 0.75 μm and 4.5 μm, and assuming a cross-sectional area (S) of the current path to be 4.3 μm×3.75 mm (QCL ridge width×QCL gain section length), a calculated resistance (R=ρt/S) may be determined to be about 1.39Ω. In the present example, the estimated voltage across the passive layers at the rollover point (I=1.5 A, FIG. 11B) is therefore 2.085 V, which is in good agreement with experimental results (e.g., as shown in FIG. 11C). The measurements thus indicate that III-V MWIR QCL PICs, as disclosed herein, may be operated using current extraction through the substrate without introducing a heavily-doped current injection layer.

Figure 12:
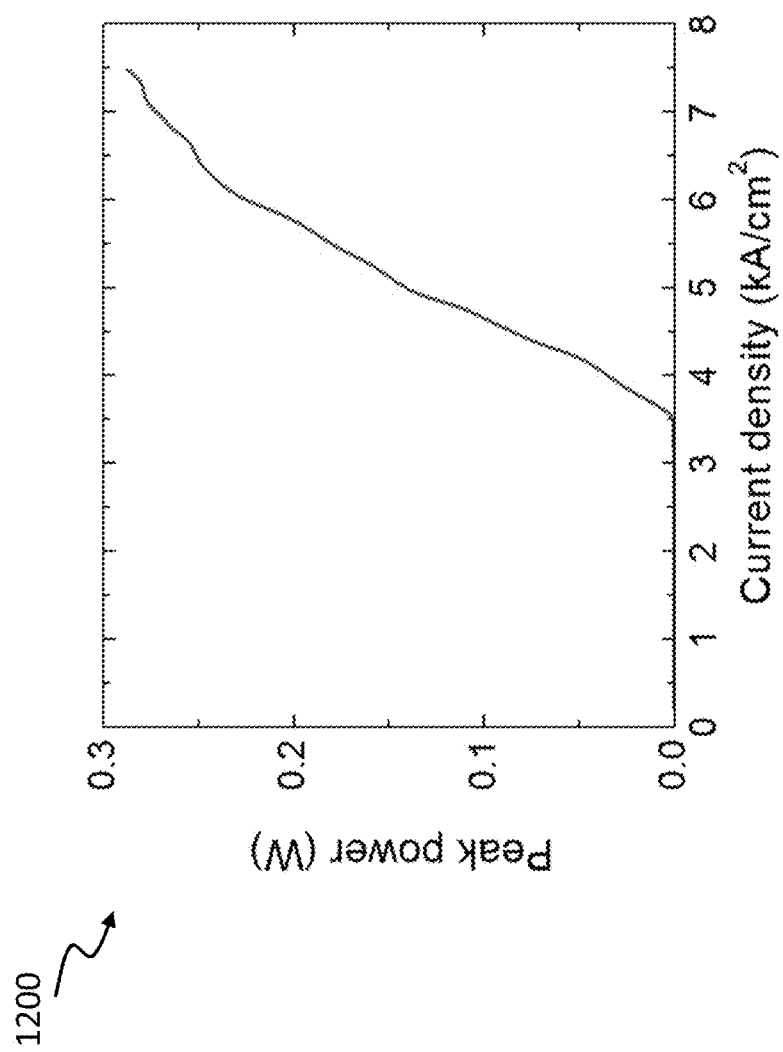
FIG. 12 illustrates a plot showing the peak output optical power collected from a device having a wide QCL gain section and a high-reflectivity coating applied to the QCL facet, in accordance with some embodiments.

The measurement results for the PIC QCLs devices discussed above with reference to FIGS. 11A, 11B, and 11C demonstrate a significant gain in optical power measured from the passive waveguide facet, for example, as compared to at least some existing devices. To be sure, even higher values of optical power may be coupled to the passive waveguides of the same dimensions, for instance, if the ridge width of QCL gain section is increased and if a high-reflection coating (e.g., such as $Al_2O_3$/Ti/Au/=100 nm/10 nm/100 nm) is applied to the QCL cleaved facet. Referring to FIG. 12, illustrated therein is a plot 1200 showing the peak output optical power collected from a QCL PIC with a 6.5-mm-long 90-degree bent passive waveguide coupled to a 1-mm-long taper section and a 10.5-μm-wide, 3.75-mm-long QCL gain section. In this example, the passive waveguide has the same dimensions (e.g., such as passive waveguide ridge width) as for the devices described above. In addition, in an embodiment, a relatively large waveguide bending radius of about 250 μm may be used to ensure a negligibly small bending loss (e.g., <0.1 dB). As shown in FIG. 12, the wider QCL gain section and high-reflectivity coating applied to the QCL facet result in a reduced threshold current density of 3.5 kA/cm$^2$ and higher slope efficiency, compared to PIC devices with the 4.3-μm wide gain sections, previously described. In the present example, nearly 290 mW of peak power output from the waveguide facet was measured, which represents approximately an order of magnitude improvement over the power outputs obtained from heterogeneously-integrated QCLs.

Given the estimated passive waveguide facet reflectivity of about 30%, it is determined that over 400 mW of mid-IR optical power at λ≈4.6 μm is coupled from the QCL gain section 202 to the passive waveguide section 206 for the present device.

Figure 13A:
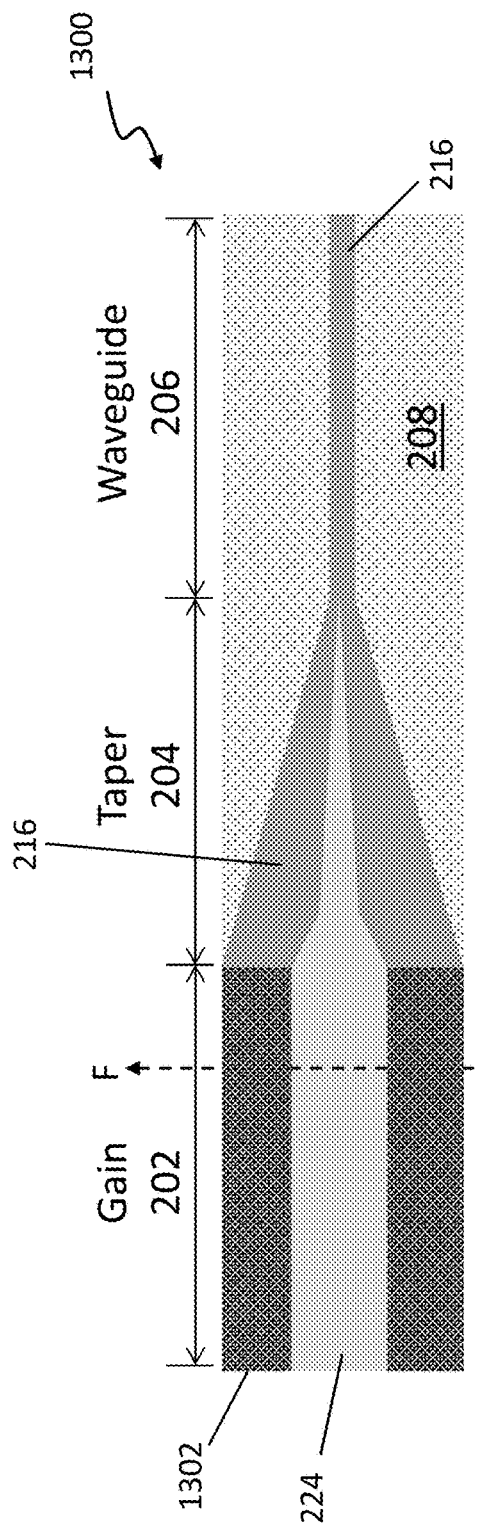
FIG. 13A shows a top-down view of an exemplary buried-heterostructure (BH) mid-IR PIC device, in accordance with some embodiments.
Figure 13B:
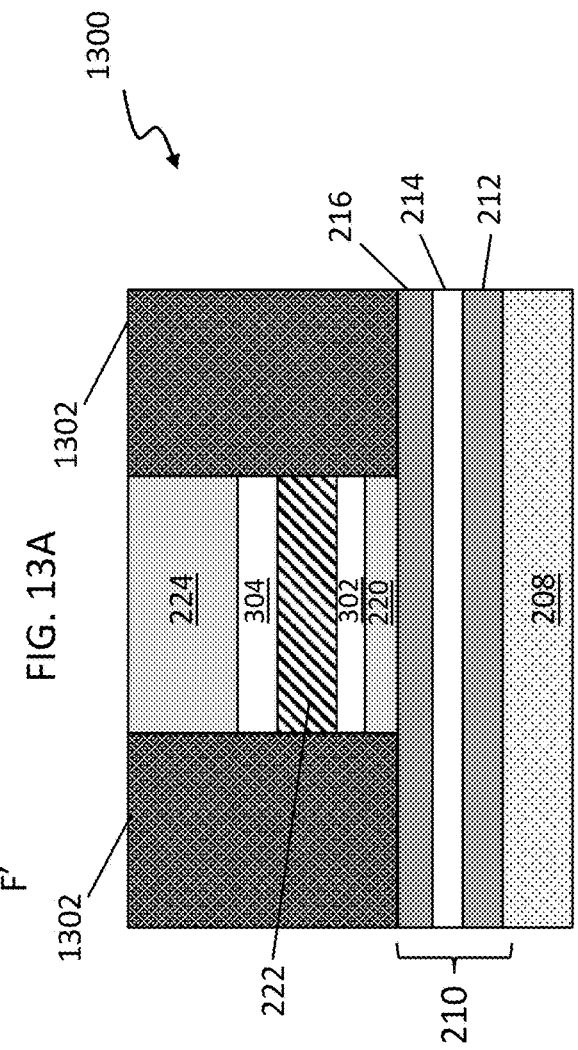
FIG. 13B shows a cross-sectional view along a section F-F' of the exemplary BH mid-IR PIC device of FIG. 13A, according to some embodiments.

The III-V homogeneous photonic integration approach, described herein, further provides for the fabrication of buried-heterostructure (BH) QCL-based PIC devices, such as a BH QCL-based PIC device 1300 shown in FIGS. 13A and 13B. In various examples, BH QCL-based PIC devices are configured to provide low-waveguide loss and improved heat extraction of the QCL gain section 202. The BH QCL-based PIC device 1300 of FIGS. 13A and 13B are in various respects substantially similar to the device 200 as illustrated in FIGS. 2A and 3, respectively. Specifically, FIG. 13A shows a top-down view of the BH QCL-based PIC device 1300, and FIG. 13B shows a cross-sectional view of the BH QCL-based PIC device 1300 along a section F-F' of FIG. 13A. In some embodiments, the BH QCL-based PIC device 1300 includes the passive waveguide heterostructure 210, the QCL heterostructure 218, the QCL core layer 240, as well as other layers previously described. However, by way of example, fabrication of the BH QCL-based PIC device 1300 may further include epitaxial overgrowth of Fe-doped InP cladding layers over a ridge waveguide QCL devices, such as those discussed herein. In some embodiments, a dielectric mask (e.g., such as silicon nitride) may be deposited over the BH QCL-based PIC device 1300 and patterned (e.g., by a photolithography and etching process) to expose regions on either side of the QCL heterostructure 218 (including exposing opposing sidewalls of the QCL heterostructure 218) within the QCL gain section 202, while the dielectric mask remains over a top surface QCL heterostructure 218 and over the taper section 204 and the passive waveguide section 206. Thereafter, in some embodiments, an Fe-doped InP cladding layer 1302 may be epitaxially grown, by one of the methods discussed above, over the exposed regions on either side of the QCL heterostructure 218 (including over the exposed opposing sidewalls of the QCL heterostructure 218) within the QCL gain section 202, while other portions of the BH QCL-based PIC device 1300 remain protected by the patterned dielectric mask. After formation of the Fe-doped InP cladding layer 1302, in some cases, the patterned dielectric mask is removed (e.g., by an etching process). In alternative embodiments, the Fe-doped InP cladding layer 1302 may be formed over the entire BH QCL-based PIC device 1300. In some embodiments, the overgrown Fe-doped InP cladding layer 1302 may be partially removed to retain desired functionalities of the photonic devices integrated therein. It is also noted that implementation of the BH process to QCL-based PIC devices fabricated using a heterogeneous integration approach may be highly challenging due to the presence of a physical bonding interface, previously described, which is problematic for high-temperature epitaxial processes.

With respect to the description provided herein, the present disclosure provides a homogeneously-integrated III-V mid-IR QCL-based PIC. Unlike mid-IR PICs based on heterogeneous integration of QCLs with Si-based passive waveguiding platforms, embodiments of the present disclosure provide for a single epitaxial growth of both the QCL and the passive waveguide heterostructures. As a result, the reliability, heat extraction, and performance of the mid-IR PIC sources is dramatically improved. In some examples, the disclosed QCL PIC devices provide 290 mW of optical power measured from the facet of the passive $In_{0.53}Ga_{0.47}As$ optical waveguides at room temperature. Such an output power represents an order of magnitude improvement over the best results obtained with at least some existing heterogeneously-integrated devices. In some embodiments, the disclosed devices exhibit a passive waveguide loss of about ~2.2 dB/cm. The mid-IR PICs disclosed herein include a QCL gain section, a taper section, and a passive waveguide section, where the taper section includes a two-step adiabatic taper to couple the QCL mode to the passive waveguide mode. In various embodiments, a lower confinement layer and an upper confinement layer may also be formed to provide high refractive index layers above and below the QCL active region of the QCL gain section, which improve laser mode confinement and provide for efficient lasing operation. In some embodiments, the adiabatic taper coupling efficiency is estimated to be about 72%, although higher efficiency may be achieved by adjusting the thickness of the device heterostructures and further optimizing the taper dimensions. In some examples, homogeneously-integrated MWIR QCL PICs may be operated using current extraction through the substrate, rather than using lateral current extraction. Such an approach makes fabrication, packaging, and operation of QCL gain elements in the PIC similar to that of conventional QCLs, which is crucial for the development of reliable mid-IR QCLs PICs for many applications demanding continuous-wave and high-power operation.

Those of skill in the art will readily appreciate that the methods and structures described herein may be applied to a variety of other semiconductor devices to advantageously achieve similar benefits from such other devices without departing from the scope of the present disclosure. Further, in some examples, the devices disclosed herein may be integrated with and/or include various other devices and features, such as transistors, resistors, capacitors, inductors, diodes, fuses, memory and/or other logic circuits, etc. In some embodiments, the devices disclosed herein may include a plurality of interconnected PICs. In some examples, the QCL PIC devices described herein may further be integrated on a substrate including other types of optoelectronic devices such as resonator sensors, detectors, modulators, couplers, isolators, photodiodes, or other appropriate device. In some cases, the QCL PIC devices may be formed over and coupled (e.g., by way of one or more vias) to underlying CMOS circuits and/or devices, for example, as part of a 3D hybrid integrated photonics/CMOS device.

Thus, one of the embodiments of the present disclosure described a semiconductor device including a substrate, a passive waveguide heterostructure formed over the substrate, and a quantum cascade laser (QCL) heterostructure formed over the passive waveguide heterostructure. In some embodiments, the passive waveguide heterostructure includes a lower passive waveguide cladding layer disposed over the substrate, a passive waveguide core layer disposed over the lower passive waveguide cladding layer, and an upper passive waveguide cladding layer disposed over the passive waveguide core layer. By way of example, the QCL heterostructure includes a lower cladding layer disposed over the upper passive waveguide cladding layer, a QCL core layer disposed over the lower cladding layer, and an upper cladding layer disposed over the QCL core layer. In some embodiments, the QCL core layer includes a lower confinement layer, a QCL active region disposed over the lower confinement layer, and an upper confinement layer disposed over the QCL active region. In various cases, the QCL active region has a first refractive index, the lower confinement layer has a second refractive index, and the upper confinement layer has a third refractive index. In some embodiments, the second refractive index and the third refractive index are both greater than the first refractive index.

In another of the embodiments, discussed is a photonic integrated circuit device including a passive waveguide section formed over a substrate, a quantum cascade laser (QCL) gain section formed over the substrate and adjacent to the passive waveguide section, and a taper section disposed between and in contact with each of the passive waveguide section and the QCL gain section. In some embodiments, the passive waveguide section includes a passive waveguide core layer disposed between a first cladding layer and a second cladding layer. In some examples, the QCL gain section includes a QCL active region disposed between a first confinement layer and a second confinement layer, where the QCL active region has a lower index of refraction than each of the first and second confinement layers. In some embodiments, the taper section is configured to optically couple the QCL gain section to the passive waveguide section.

In yet another of the embodiments, discussed is a semiconductor device including a taper section. The semiconductor device further includes a passive waveguide section adjacent to and in contact with a first side of the taper section, where the passive waveguide section includes a passive waveguide heterostructure having a passive waveguide core layer disposed between a first cladding layer and a second cladding layer. The semiconductor device further includes a quantum cascade layer (QCL) gain section adjacent to and in contact with a second side of the taper section opposite the first side of the taper section, where the QCL gain section includes a QCL active region disposed between a lower confinement layer and an upper confinement layer, and where the QCL active region has a lower index of refraction than either the lower confinement layer or the upper confinement layer. In some embodiments, the semiconductor device further includes an epitaxial cladding layer disposed on either side of the QCL heterostructure within the QCL gain section, where the epitaxial cladding layer covers opposing sidewalls of the QCL heterostructure. In various embodiments, the taper section is configured to optically couple the QCL gain section to the passive waveguide section.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A monolithic semiconductor device, comprising:
   a substrate including InP;
   a passive waveguide heterostructure epitaxially formed over the substrate, wherein the passive waveguide heterostructure includes a lower passive waveguide cladding layer including InP disposed over the substrate, a passive waveguide core layer disposed over the lower passive waveguide cladding layer, and an upper passive waveguide cladding layer disposed over the passive waveguide core layer; and a quantum cascade laser (QCL) heterostructure formed over the passive waveguide heterostructure, wherein the QCL heterostructure includes a lower cladding layer disposed over the upper passive waveguide cladding layer, a QCL core layer disposed over the lower cladding layer, and an upper cladding layer disposed over the QCL core layer;

wherein the QCL core layer includes a lower confinement layer, a QCL active region disposed over the lower confinement layer, and an upper confinement layer disposed over the QCL active region; and wherein the QCL active region has a first refractive index, the lower confinement layer has a second refractive index, and the upper confinement layer has a third refractive index, and wherein the second refractive index and the third refractive index are both greater than the first refractive index.

2. The monolithic semiconductor device of claim 1, wherein the passive waveguide core layer has a first volume-averaged refractive index, wherein the upper passive waveguide cladding layer has a second volume-averaged refractive index, wherein the lower passive waveguide cladding layer has a third volume-averaged refractive index, and wherein the first volume-averaged refractive index is greater than both the second volume-averaged refractive index and the third volume-averaged refractive index.

3. The monolithic semiconductor device of claim 1, wherein the lower passive waveguide cladding layer, the passive waveguide core layer, the upper passive waveguide cladding layer, the lower cladding layer, the QCL core layer, and the upper cladding layer each include one or more epitaxially-grown semiconductor material layers.

4. The monolithic semiconductor device of claim 1, further comprising:
a passive waveguide section including the passive waveguide heterostructure;
a QCL gain section including the QCL heterostructure, wherein the QCL gain section is disposed adjacent to the passive waveguide section; and
a taper section disposed between and in contact with each of the passive waveguide section and the QCL gain section, wherein the taper section is configured to optically couple the QCL gain section to the passive waveguide section.

5. The monolithic semiconductor device of claim 4, wherein the taper section includes a two-step adiabatic taper of the QCL heterostructure and an adiabatic taper of the passive waveguide heterostructure, wherein in a first region of a first taper step of the two-step adiabatic taper, a first ridge width of the QCL heterostructure decreases more rapidly than a second ridge width of the passive waveguide heterostructure, and wherein in a second region of a second taper step of the two-step adiabatic taper, the first ridge width of the QCL heterostructure decreases more slowly than the second ridge width of the passive waveguide heterostructure.

6. The monolithic semiconductor device of claim 1, wherein the passive waveguide core layer of the passive waveguide heterostructure includes undoped $In_{0.53}Ga_{0.47}As$, and wherein the lower passive waveguide cladding layer and the upper passive waveguide cladding layer both include undoped InP cladding layers.

7. The monolithic semiconductor device of claim 1, wherein the passive waveguide core layer of the passive waveguide heterostructure has a thickness of 750 nm, wherein the lower passive waveguide cladding layer has a thickness of 3 microns, wherein the upper passive waveguide cladding layer has a thickness of 1.5 microns, and wherein the monolithic semiconductor device is configured to operate at a wavelength of 4.6 µm.

8. The monolithic semiconductor device of claim 1, wherein the QCL active region includes strain-compensated or lattice-matched epitaxial semiconductor layers.

9. The monolithic semiconductor device of claim 1, wherein the QCL active region includes a strain-compensated InGaAs/AlInAs hetero structure, and wherein the lower confinement layer and the upper confinement layer include doped $In_{0.53}Ga_{0.47}As$.

10. The monolithic semiconductor device of claim 1, wherein the QCL active region has a thickness of 1.66 microns, wherein the lower confinement layer has a thickness of 350 nm, wherein the upper confinement layer has a thickness of 500 nm, and wherein the semiconductor device is configured to operate at a wavelength of 4.6 µm.

11. The monolithic semiconductor device of claim 1, further comprising:
a current injection layer disposed between the upper passive waveguide cladding layer of the passive waveguide heterostructure and the lower cladding layer of the QCL heterostructure.

12. The monolithic semiconductor device of claim 1, wherein a bottom surface of a QCL ridge of the QCL heterostructure is disposed within the lower cladding layer.

13. A photonic integrated circuit device, comprising:
a passive waveguide section formed over a substrate, wherein the passive waveguide section includes a passive waveguide core layer disposed between a first cladding layer and a second cladding layer; and
a quantum cascade laser (QCL) gain section formed over the substrate and adjacent to the passive waveguide section, wherein the QCL gain section includes a QCL active region disposed between a first confinement layer and a second confinement layer, and wherein the QCL active region has a lower index of refraction than each of the first and second confinement layers; and
a taper section disposed between and in contact with each of the passive waveguide section and the QCL gain section, wherein the taper section is configured to optically couple the QCL gain section to the passive waveguide section;
wherein the taper section includes a two-step adiabatic taper of a QCL heterostructure and an adiabatic taper of a passive waveguide heterostructure, wherein in a first region of a first taper step of the two-step adiabatic taper, a first ridge width of the QCL heterostructure decreases more rapidly than a second ridge width of the passive waveguide heterostructure, and wherein in a second region of a second taper step of the two-step adiabatic taper, the first ridge width of the QCL heterostructure decreases more slowly than the second ridge width of the passive waveguide heterostructure.

14. The photonic integrated circuit device of claim 13, wherein the taper section is configured to match effective refractive indices of a QCL mode and a passive waveguide mode.

15. The photonic integrated circuit device of claim 13, wherein the first taper step of the two-step adiabatic taper of the QCL heterostructure is 0.1 mm long and has a first width that tapers from 6 microns to 5 microns, and wherein the second taper step of the two-step adiabatic taper is 0.9 mm long and has a second width that tapers from 5 microns to 1.75 microns.

16. The photonic integrated circuit device of claim 13, wherein the adiabatic taper of the passive waveguide heterostructure is 1 mm long and has a width that tapers from 30 microns to 5 microns.

17. The photonic integrated circuit device of claim 13, wherein the passive waveguide core layer of the passive waveguide section defines a first horizontal plane, wherein the QCL active region of the QCL gain section defines a second horizontal plane parallel to the first horizontal plane and separated from the first horizontal plane by one or more cladding layers.

18. The photonic integrated circuit device of claim 13, wherein the first cladding layer is in contact with the substrate, wherein the first cladding layer includes a first material, and wherein the substrate includes a second material that is the same as the first material.

19. A semiconductor device, comprising:
 a taper section;
 a passive waveguide section adjacent to and in contact with a first side of the taper section, wherein the passive waveguide section includes a passive waveguide heterostructure having a passive waveguide core layer disposed between a first cladding layer and a second cladding layer;
 a quantum cascade layer (QCL) gain section adjacent to and in contact with a second side of the taper section opposite the first side of the taper section, wherein the QCL gain section includes a QCL active region disposed between a lower confinement layer and an upper confinement layer, and wherein the QCL active region has a lower index of refraction than either the lower confinement layer or the upper confinement layer; and
 an epitaxial cladding layer disposed on either side of a QCL heterostructure within the QCL gain section, wherein the epitaxial cladding layer covers opposing lateral sidewalls of the QCL heterostructure, wherein the epitaxial cladding layer contacts a top surface of a portion of the passive waveguide heterostructure within the QCL gain section, and wherein the epitaxial cladding layer includes an Fe-doped InP cladding layer formed entirely by epitaxial growth;
 wherein the taper section is configured to optically couple the QCL gain section to the passive waveguide section.

20. The semiconductor device of claim 19, wherein the taper section includes a two-step adiabatic taper of the QCL heterostructure and an adiabatic taper of the passive waveguide heterostructure, wherein in a first region of a first taper step of the two-step adiabatic taper, a first ridge width of the QCL heterostructure decreases more rapidly than a second ridge width of the passive waveguide heterostructure, and wherein in a second region of a second taper step of the two-step adiabatic taper, the first ridge width of the QCL heterostructure decreases more slowly than the second ridge width of the passive waveguide heterostructure.

* * * * *